US010431278B2

(12) United States Patent
Li et al.

(10) Patent No.: US 10,431,278 B2
(45) Date of Patent: *Oct. 1, 2019

(54) DYNAMICALLY CONTROLLING VOLTAGE FOR ACCESS OPERATIONS TO MAGNETO-RESISTIVE RANDOM ACCESS MEMORY (MRAM) BIT CELLS TO ACCOUNT FOR AMBIENT TEMPERATURE

(71) Applicant: QUALCOMM Incorporated, San Diego, CA (US)

(72) Inventors: Xia Li, San Diego, CA (US); Wah Nam Hsu, San Diego, CA (US); Wei-Chuan Chen, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/676,957

(22) Filed: Aug. 14, 2017

(65) Prior Publication Data
US 2019/0051341 A1  Feb. 14, 2019

(51) Int. Cl.
  *G11C 11/16*  (2006.01)
  *G11C 5/14*  (2006.01)
  (Continued)

(52) U.S. Cl.
  CPC .......... *G11C 11/1697* (2013.01); *G11C 5/147* (2013.01); *G11C 7/04* (2013.01);
  (Continued)

(58) Field of Classification Search
  CPC .............. G11C 11/1697; G11C 11/161; G11C 11/1659; G11C 11/1655; G11C 11/1657;
  (Continued)

(56) References Cited

U.S. PATENT DOCUMENTS 7,035,137 B2   4/2006 Iwata et al.
7,145,824 B2  12/2006 Bill et al.
(Continued)

OTHER PUBLICATIONS

Co-pending U.S. Appl. No. 15/414,855, filed Jan. 17, 2017.
International Search Report and Written Opinion for PCT/US2018/046489, dated Dec. 6, 2018, 13 pages.

*Primary Examiner* — Sung Il Cho
(74) *Attorney, Agent, or Firm* — W&T/Qualcomm

(57) ABSTRACT

Dynamically controlling voltage for access operations to magneto-resistive random access memory (MRAM) bit cells to account for ambient temperature is disclosed. An MRAM bit cell process variation measurement circuit (PVMC) is configured to measure process variations and ambient temperature in magnetic tunnel junctions (MTJs) that affect MTJ resistance, which can change the write current at a given fixed supply voltage applied to an MRAM bit cell. These measured process variations and ambient temperature are used to dynamically control a supply voltage for access operations to the MRAM to reduce the likelihood of bit errors and reduce power consumption. The MRAM bit cell PVMC may also be configured to measure process variations and/or ambient temperatures in logic circuits that represent the process variations and ambient temperatures in access transistors employed in MRAM bit cells in the MRAM to determine variations in the switching speed (i.e., drive strength) of the access transistors.

25 Claims, 21 Drawing Sheets

(51) Int. Cl.
*G11C 7/04* (2006.01)
*G11C 29/50* (2006.01)
*H01L 27/22* (2006.01)
*H01L 43/08* (2006.01)

(52) U.S. Cl.
CPC ........ *G11C 11/161* (2013.01); *G11C 11/1659* (2013.01); *G11C 11/1673* (2013.01); *G11C 11/1675* (2013.01); *G11C 29/50* (2013.01); *G11C 29/50012* (2013.01); *G11C 11/1655* (2013.01); *G11C 11/1657* (2013.01); *G11C 2029/5002* (2013.01); *H01L 27/228* (2013.01); *H01L 43/08* (2013.01)

(58) Field of Classification Search
CPC ........... G11C 5/147; G11C 7/04; G11C 29/50; G11C 29/50012; G11C 29/5002; H01L 27/228; H01L 43/08
USPC .......................................................... 365/158
See application file for complete search history.

(56) References Cited

U.S. PATENT DOCUMENTS

| | | | |
|---|---|---|---|
| 7,405,589 B2 | 7/2008 | Lewis et al. | |
| 8,693,238 B2 | 4/2014 | Sakimura et al. | |
| 9,025,367 B1* | 5/2015 | Lin | G11C 11/1673 365/158 |
| 9,076,542 B2 | 7/2015 | Sohn et al. | |
| 9,135,975 B2 | 9/2015 | Kim et al. | |
| 9,311,980 B1 | 4/2016 | Gogl et al. | |
| 9,378,797 B2 | 6/2016 | Antonyan | |
| 9,418,761 B2 | 8/2016 | Arslan et al. | |
| 9,502,088 B2* | 11/2016 | Jung | G11C 11/1673 |
| 9,541,605 B1* | 1/2017 | Kothandaraman | G01R 31/3278 |
| 2005/0088875 A1* | 4/2005 | Abraham | G11C 11/16 365/158 |
| 2008/0002481 A1* | 1/2008 | Gogl | G11C 5/02 365/189.06 |
| 2008/0247222 A1* | 10/2008 | Jung | G11C 11/1659 365/158 |
| 2009/0154274 A1* | 6/2009 | Abu-Rahma | G11C 7/02 365/203 |
| 2009/0323405 A1* | 12/2009 | Jung | G11C 11/1673 365/158 |
| 2010/0142303 A1* | 6/2010 | Park | G11C 7/06 365/209 |
| 2010/0157654 A1* | 6/2010 | Jung | G11C 7/12 365/148 |
| 2010/0188894 A1* | 7/2010 | Rao | G11C 11/1655 365/171 |
| 2011/0128771 A1* | 6/2011 | Rao | G11C 13/0004 365/148 |
| 2011/0176350 A1* | 7/2011 | Jung | G11C 11/16 365/148 |
| 2012/0218815 A1* | 8/2012 | Kim | G11C 11/1673 365/171 |
| 2013/0293286 A1* | 11/2013 | Li | G11C 7/062 327/538 |
| 2013/0308374 A1 | 11/2013 | Gogl et al. | |
| 2013/0322162 A1* | 12/2013 | Lee | G11C 7/12 365/158 |
| 2014/0146600 A1* | 5/2014 | Sohn | G11C 11/1697 365/158 |
| 2014/0167831 A1* | 6/2014 | Wu | H03K 3/59 327/291 |
| 2014/0254251 A1* | 9/2014 | Lee | G11C 29/00 365/158 |
| 2014/0269031 A1* | 9/2014 | Jung | G11C 11/1673 365/158 |
| 2014/0285226 A1* | 9/2014 | Li | G11C 13/0002 324/705 |
| 2015/0036409 A1* | 2/2015 | Jung | G11C 11/161 365/66 |
| 2015/0063012 A1* | 3/2015 | Jung | G11C 7/06 365/158 |
| 2015/0070978 A1* | 3/2015 | Kim | G11C 11/1659 365/158 |
| 2015/0070979 A1* | 3/2015 | Zhu | G09C 1/00 365/158 |
| 2015/0071432 A1* | 3/2015 | Zhu | G11C 11/1673 380/28 |
| 2015/0092469 A1* | 4/2015 | Kim | G11C 11/1673 365/148 |
| 2015/0092479 A1* | 4/2015 | Dong | G11C 7/1075 365/158 |
| 2015/0117086 A1* | 4/2015 | Kim | G11C 11/1675 365/148 |
| 2015/0228322 A1* | 8/2015 | Jung | G11C 11/1673 365/158 |
| 2015/0262708 A1* | 9/2015 | Lee | H01L 25/18 365/191 |
| 2016/0064058 A1 | 3/2016 | Janesky et al. | |
| 2016/0093351 A1* | 3/2016 | Jung | G11C 11/1673 365/158 |
| 2016/0093352 A1* | 3/2016 | Jung | G11C 11/1673 365/158 |
| 2016/0148666 A1* | 5/2016 | Rosenberg | G11C 11/1673 365/158 |
| 2016/0190436 A1 | 6/2016 | Hu et al. | |
| 2017/0004868 A1* | 1/2017 | Ghosh | G11C 11/1673 |

* cited by examiner

DYNAMICALLY CONTROLLING VOLTAGE FOR ACCESS OPERATIONS TO MAGNETO-RESISTIVE RANDOM ACCESS MEMORY (MRAM) BIT CELLS TO ACCOUNT FOR AMBIENT TEMPERATURE

BACKGROUND

I. Field of the Disclosure

The technology of the disclosure relates generally to magneto-resistive random access memory (MRAM), and more particularly to performing access operations in MRAM bit cells in MRAM.

II. Background

Semiconductor storage devices are used in integrated circuits (ICs) in electronic devices to provide data storage. One example of a semiconductor storage device is magneto-resistive random access memory (MRAM). MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written and stored in the MTJ by applying a magnetic field to change the magnetic orientation of the free layer to either a P or AP magnetic orientation with respect to the pinned layer.

Recent developments in MTJ devices involve spin transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 illustrates an STT-MTJ device 100. The STT-MTJ device 100 is provided as part of an MRAM bit cell 102 to store non-volatile data. A metal-oxide semiconductor (MOS) (typically n-type MOS, (NMOS)) access transistor 104 is provided to control reading and writing to the STT-MTJ device 100. A drain (D) of the access transistor 104 is coupled to a bottom electrode 106 of the STT-MTJ device 100, which is coupled to a pinned layer 108 for example. A word line (WL) is coupled to a gate (G) of the access transistor 104. A source (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the STT-MTJ device 100, which is coupled to a free layer 112 for example. The pinned layer 108 and the free layer 112 are separated by a tunnel barrier 114.

With continuing reference to FIG. 1, when writing data to the STT-MTJ device 100, the gate (G) of the access transistor 104 is activated by activating the word line (WL). A voltage differential (i.e., a supply voltage) between a voltage ($V_{BL}$) on the bit line (BL) and the voltage ($V_{SL}$) on the source line (SL) is applied. As a result, a write current (I) is generated between the drain (D) and the source (S) of the access transistor 104. If the magnetic orientation of the STT-MTJ device 100 in FIG. 1 is to be changed from AP to P, a write current ($I_{AP-P}$) flowing from the free layer 112 to the pinned layer 108 is generated. This induces an STT at the free layer 112 to change the magnetic orientation of the free layer 112 to P with respect to the pinned layer 108. If the magnetic orientation is to be changed from P to AP, a current ($I_{P-AP}$) flowing from the pinned layer 108 to the free layer 112 is produced, which induces an STT at the free layer 112 to change the magnetic orientation of the free layer 112 to AP with respect to the pinned layer 108.

As discussed above, a supply voltage can be applied across an MTJ in an MRAM bit cell to generate current for performing write operations. For example, a supply voltage may be a fixed supply voltage applied across an overall circuit and/or chip in which an MTJ in an MRAM bit cell is provided. In order to write to the MTJ, a write current ($I_w$) is generated to equal or exceed a critical switching current ($I_c$), which is the current required to switch a magnetic orientation of a free layer of the MTJ. In an STT-MTJ device, the critical switching current ($I_e$) required to switch the magnetic orientation of the free layer from P to AP is higher than the critical switching current ($I_e$) required to switch from AP to P. Thus, a higher supply voltage is generally employed to change the MTJ magnetization state from P to AP than from AP to P in a write operation. If the write current is below the critical switching current (i.e., $I_w < I_c$), the write current may not be sufficient to switch the state of the MTJ, resulting in a bit error. A bit error is a failed attempt to write the MTJ to an intended state. Since the MTJ is quantum mechanical in nature, the critical switching current ($I_e$) is not a single theoretical value, but rather a distribution of values, where the probability of the MTJ switching its state increases as the current flowing across it increases. In order to reduce the risk of bit errors, a designed critical switching current can be selected along a critical switching current curve at a value higher than the theoretical critical switching current. Switching current margin is the difference between the designed critical switching current and the theoretical critical switching current. The design specifications of MRAM bit cells can thus provide a minimum switching current margin to avoid or mitigate erroneous data write operations such as bit errors.

Process variations can cause process corner variations that change the speed at which current flows through the access transistor 104 used to control write operations to the STT-MTJ device 100 in the MRAM bit cell 102 in FIG. 1. For example, process variations can vary the switching speed of the access transistor 104 in the MRAM bit cell 102 in FIG. 1 between typical, typical (TT), fast, fast (FF), and slow, slow (SS). If for example, process variations result in the access transistor 104 having higher impurity levels (i.e., a slow transistor), a higher gate voltage may be required to raise the write current to the designed critical switching current in order to avoid bit errors. However, as voltage increases, so does power, which can cause the access transistor 104 to rise in temperature. Such increases in temperature can result in damage to the gate oxide of the access transistor 104 through mechanisms such as time-dependent dielectric breakdown. In the opposite case, a fast access transistor 104 can require a lower gate voltage in order to lower the write current to the designed critical switching current. If the supply voltage is not lowered and the designed critical switching current is exceeded, power consumption can become inefficient and the tunnel barrier 114 is overstressed by the write process.

IC designs that include MRAM may employ a fixed supply voltage with a larger corner overhead to cover for process variations that can vary switching current. One disadvantage to providing a larger corner overhead in supply voltage is that switching current margin is increased, which can overstress certain MTJs based on process corner variation and also damage gate oxides of access transistors. This voltage stress can ultimately result in the failure of both MTJs and access transistors. However, if the switching current margin is too low, the switching current may not be sufficient to perform a write operation, thus resulting in increased bit errors and reduced reliability.

SUMMARY OF THE DISCLOSURE

Aspects disclosed in the detailed description include dynamically controlling voltage for access operations to magneto-resistive random access memory (MRAM) bit cells to account for ambient temperature. Related devices, methods, and systems are also disclosed. MRAM bit cells in an MRAM each include a magnetic tunnel junction (MTJ) as a storage element and an access transistor. Read and write operations are performed by applying a voltage to a gate of the access transistor, which in turn allows a supply voltage to drive a current through the MTJ for performing the read and write operations. Process variations in the fabrication of MRAM bit cells can lead to variations in both the resistance of MTJs and the switching speed of access transistors. Variations in ambient temperature at MRAM bit cells can lead to operational variations in both the resistance of MTJs and the switching speed of access transistors. At a fixed supply voltage, these process and operational variations in the resistance of MTJs and the switching speed of access transistors can result in generation of a switching current that is too low to reliably write a state to the MTJ. In response, a fixed supply voltage with a larger corner overhead could be provided to power the MRAM to account for process variations and ambient temperature that can vary switching current to provide a switching current margin. However, if the switching current margin is too high, the MTJs in the MRAM can be overstressed and risk damaging the access transistors. However, if the switching current margin is too low, write operations may result in bit errors and reduced reliability.

Thus, exemplary aspects disclosed herein include dynamically controlling voltage for write operations to MRAM bit cells to account for process variations and ambient temperature. In exemplary aspects, an MRAM bit cell process variation measurement circuit (PVMC) is provided and configured to measure at least one process variation and ambient temperature in MRAM bit cells in an MRAM. These measured process variations and ambient temperature in MTJs affect MTJ resistance, which can change the write current at a given fixed supply voltage applied to an MRAM bit cell. These measured process variations and ambient temperature in the MTJs are used to dynamically control a supply voltage for access operations to the MRAM. In this manner, for example, switching current for write operations can be dynamically increased to account for switching current margins that are too low due to low ambient temperatures, thus reducing the likelihood of bit errors and reduced reliability. Further, as another example, switching current for write operations can also be dynamically decreased to account for switching current margins that are too high, thus reducing power consumption and the need for design overhead, and the risk of damaging MRAM bit cells due to voltage stress.

Further, in some examples, the MRAM bit cell PVMC may also optionally be configured to measure process variations and/or ambient temperatures in logic circuits that represent the process variations and ambient temperatures in access transistors employed in MRAM bit cells in the MRAM to determine variations in the switching speed (i.e., drive strength) of the access transistors.

In this regard in one aspect, an MRAM bit cell PVMC for determining process variation and ambient temperature in MRAM bit cells in an MRAM array is provided. The MRAM bit cell PVMC includes a supply voltage input configured to receive a supply voltage coupled to the MRAM array. The MRAM bit cell PVMC further includes an MRAM bit cell PVMC output. The MRAM bit cell PVMC further includes an MTJ PVMC coupled to the supply voltage input. The MTJ PVMC includes one or more MTJ circuits. Each MTJ circuit includes a measurement transistor of a metal oxide semiconductor (MOS) type of an access transistor in at least one MRAM bit cell in the MRAM array, and a measurement MTJ device of a type of an MTJ device in the at least one MRAM bit cell in the MRAM array. The measurement MTJ device is coupled to the measurement transistor. The MTJ PVMC further includes an MTJ PVMC output coupled to the MRAM bit cell PVMC output. The MRAM bit cell PVMC further includes an ambient temperature input coupled to the MRAM bit cell PVMC output. The ambient temperature input is configured to receive an ambient temperature measurement voltage signal representing an ambient temperature at the at least one MRAM bit cell in the MRAM array. The MRAM bit cell PVMC is configured to provide, on the MRAM bit cell PVMC output, at least one MRAM bit cell PVMC output voltage signal representing at least one of the process variation of the at least one MRAM bit cell in the MRAM array as a function of the supply voltage coupled to the MRAM bit cell PVMC and the ambient temperature at the at least one MRAM bit cell in the MRAM array.

In another aspect, an MRAM bit cell PVMC is provided. The MRAM bit cell PVMC includes a means for coupling a supply voltage coupled to an MRAM array to a means for measuring MTJ process variation. The means for measuring MTJ process variation includes a means for generating an MTJ process variation measurement indicator representing process variation of at least one MRAM bit cell in the MRAM array, as a function of the supply voltage. The MRAM bit cell PVMC further includes a means for receiving an ambient temperature measurement indicator. The MRAM bit cell PVMC further includes a means for providing an output of the MRAM bit cell PVMC coupled to the means for measuring MTJ process variation and the means for receiving the ambient temperature measurement indicator.

In another aspect, a method of measuring process variation and ambient temperature in MRAM bit cells in an MRAM array is provided. The method includes receiving a supply voltage coupled to the MRAM array and coupling the supply voltage from a supply voltage input to an MTJ PVMC. The MTJ PVMC includes one or more MTJ circuits.

Each MTJ circuit comprises a measurement transistor of a MOS type of an access transistor in at least one MRAM bit cell in the MRAM array and a measurement MTJ device of a type of an MTJ device in the at least one MRAM bit cell in the MRAM array. The measurement MTJ device is coupled to the measurement transistor. The method further includes providing at least one MRAM bit cell PVMC output voltage signal representing at least one of the process variation of the at least one MRAM bit cell in the MRAM array as a function of the supply voltage coupled to the MRAM array and the ambient temperature at the at least one MRAM bit cell in the MRAM array.

In another aspect a memory system is provided. The memory system includes a power management circuit configured to generate a supply voltage. The memory system further includes an MRAM array coupled to the supply voltage. The MRAM array is comprised of a plurality of MRAM bit cells. Each MRAM bit cell among the plurality of MRAM bit cells includes an MTJ device coupled to an access transistor. The memory system further includes an MRAM bit cell PVMC for determining process variation in the plurality of MRAM bit cells in the MRAM array. The MRAM bit cell PVMC includes a supply voltage input configured to receive the supply voltage generated by the power management circuit, an MRAM bit cell PVMC output coupled to the power management circuit, and an MTJ PVMC coupled to the supply voltage input. The MTJ PVMC includes one or more MTJ circuits and an MTJ PVMC output coupled to the MRAM bit cell PVMC output. Each MTJ circuit includes a measurement transistor of a MOS type of the access transistor in at least one MRAM bit cell among the plurality of MRAM bit cells in the MRAM array, and a measurement MTJ device of a type of the MTJ device in the at least one MRAM bit cell among the plurality of MRAM bit cells in the MRAM array. The measurement MTJ device is coupled to the measurement transistor. The MTJ PVMC is configured to generate, on the MTJ PVMC output, a process variation measurement voltage signal representing process variation of the at least one MRAM bit cell among the plurality of MRAM bit cells in the MRAM array, as a function of the supply voltage coupled to the MRAM bit cell PVMC. The MRAM bit cell PVMC is configured to provide, on the MRAM bit cell PVMC output, at least one MRAM bit cell PVMC output voltage signal representing the process variation of at least one MRAM bit cell in the MRAM array as a function of the supply voltage coupled to the MRAM bit cell PVMC. The memory system also includes an ambient temperature input coupled to the power management circuit. The ambient temperature input is configured to receive an ambient temperature measurement voltage signal representing ambient temperature at the at least one MRAM bit cell among the plurality of MRAM bit cells in the MRAM array. The power management circuit is further configured to receive the MRAM bit cell PVMC output voltage signal from the MRAM bit cell PVMC, receive the ambient temperature measurement voltage signal from the ambient temperature input, determine a supply voltage level based on the received process variation measurement voltage signal and the received ambient temperature measurement voltage signal, and dynamically generate the supply voltage at the determined supply voltage level.

DETAILED DESCRIPTION

Figure 1:
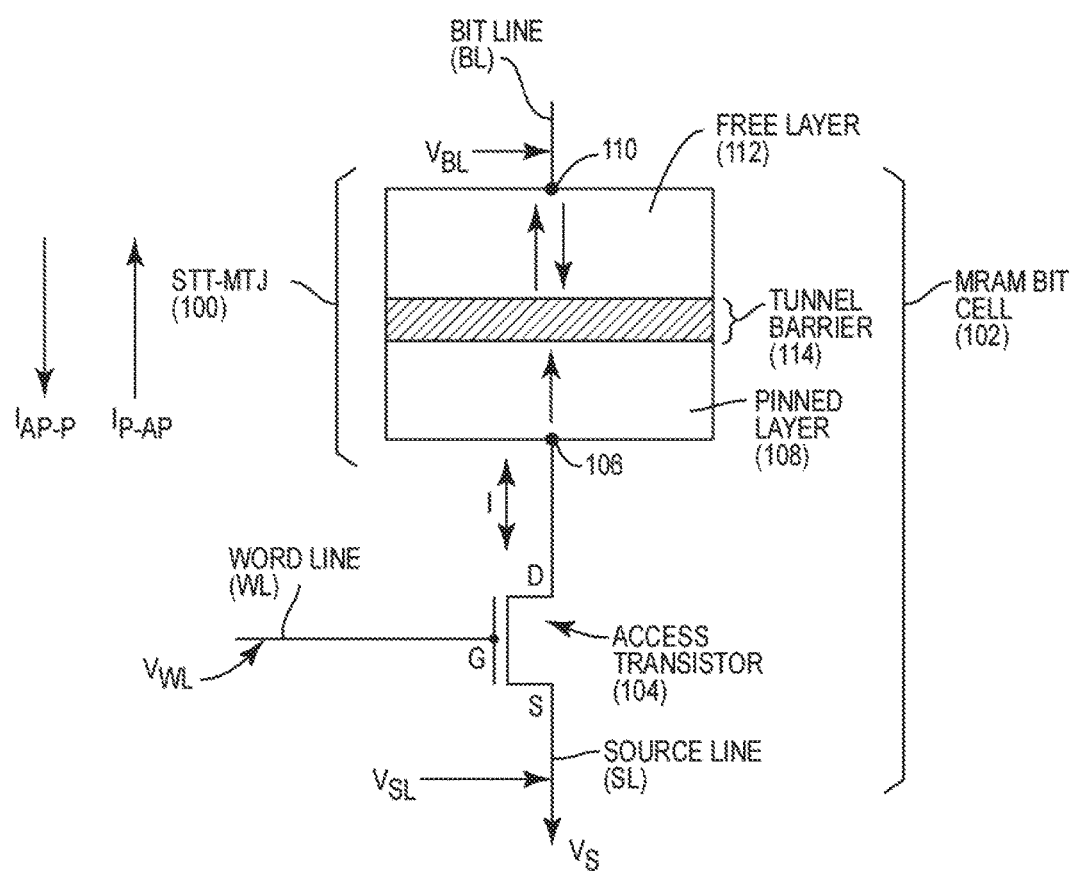
FIG. 1 is a schematic diagram of an exemplary magnetoresistive random access memory (MRAM) bit cell that can be provided in an MRAM array in an integrated circuit (IC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include dynamically controlling voltage for access operations to magneto-resistive random access memory (MRAM) bit cells to account for ambient temperature. In exemplary aspects, an MRAM bit cell process variation measurement circuit (PVMC) is provided and configured to measure at least one process variation and ambient temperature in MRAM bit cells in an MRAM. These measured process variations and ambient temperature in MTJs affect MTJ resistance, which can change the write current at a given fixed supply voltage applied to an MRAM bit cell. These measured process variations and ambient temperature in the MTJs are used to dynamically control a supply voltage for access operations to the MRAM. In this manner, for example, switching current for write operations can be dynamically increased to account for switching current margins that are too low due to low ambient temperatures, thus reducing the likelihood of bit errors and reduced reliability. Further, as another example, switching current for write operations can also be dynamically decreased to account for switching current margins that are too high, thus reducing power consumption and the need for design overhead, and the risk of damaging MRAM bit cells due to voltage stress.

Before discussing exemplary MRAM bit cell PVMCs that are configured to determine ambient temperature at MRAM bit cells and measure process variations in MTJs and logic circuits that affect MTJ resistance and performance of access transistors employed by MRAM bit cells in an MRAM, which starts below with reference to FIG. 4, a discussion of process variations and varying ambient temperatures in MRAM bit cells affected by process variations and varying ambient temperatures in MTJs and logic circuits is first discussed with reference to FIGS. 2A, 2B, and 3.

Figure 2A:
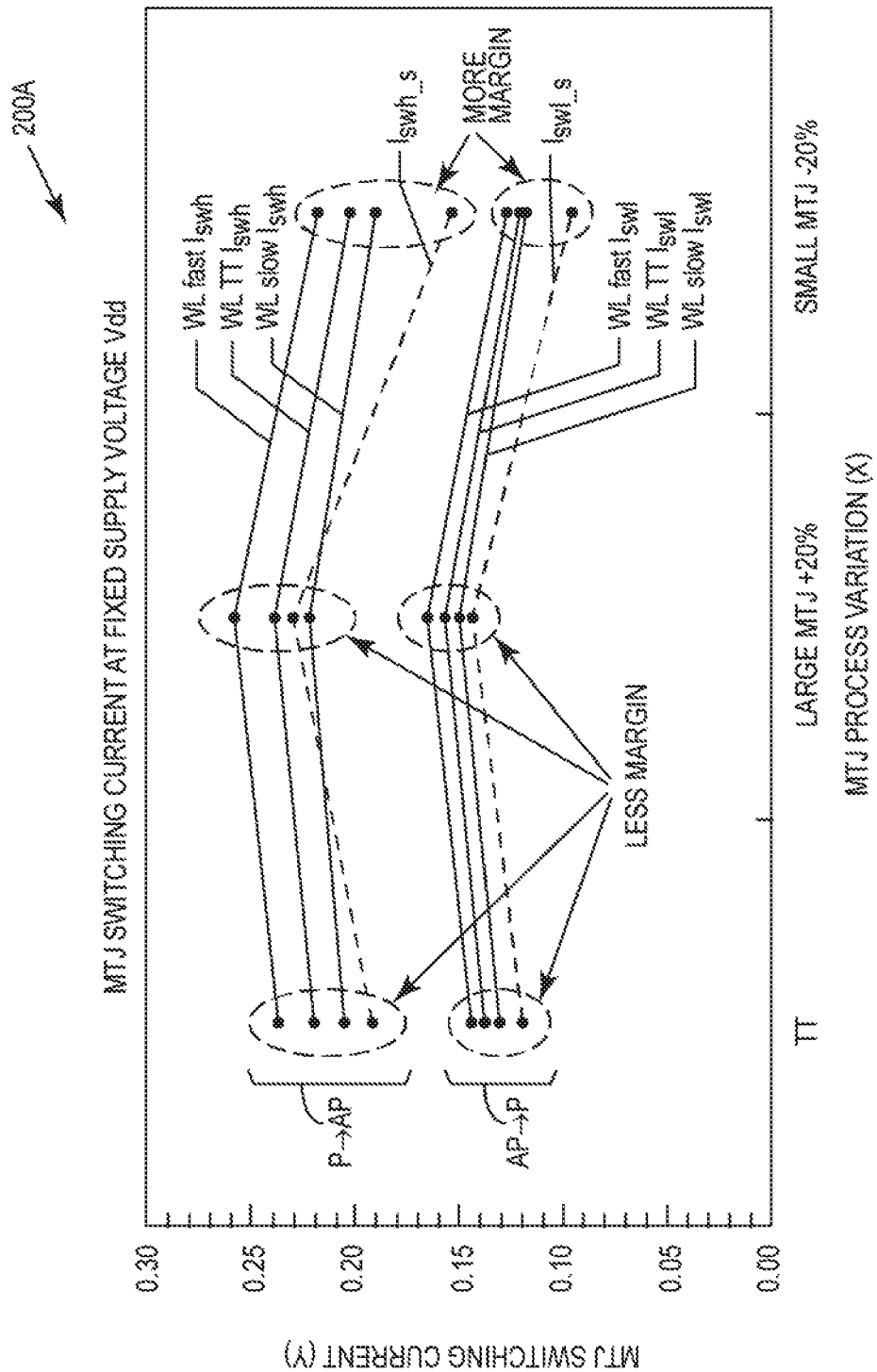
FIG. 2A is a graph illustrating exemplary switching current margin levels for writing to MRAM bit cells at a fixed supply voltage for different combinations of magnetic tunnel junction (MTJ) process variations and access transistor process variations.

In this regard, FIG. 2A is a graph 200A illustrating exemplary switching current margin levels for writing to MRAM bit cells, such as the MRAM bit cell 102 in FIG. 1, at a fixed supply voltage Vdd for different combinations of MTJ process variations and access transistor process variations. As shown in FIG. 2A, the X-axis (X) of the graph 200A illustrates MTJ process variation affecting the size of the MTJ to be typical (TT), larger than typical (e.g., +20%), or smaller than typical (e.g., −20%). The Y-axis (Y) of the graph 200A illustrates MTJ switching current for a write operation in microAmps (μA) as a function of the MTJ size and the access transistor performance, shown in this example as typical, typical (TT), slow (SS), and fast, fast (FF) for both N-type metal oxide semiconductor (MOS) (NMOS) and P-type MOS (PMOS) devices. As shown in the graph 200A, the MTJ switching current generated by an access transistor in an MRAM bit cell for the given fixed supply voltage Vdd varies based on whether the process variation of the access transistor makes the access transistor a TT, slow, or fast performance device, as well as the process variation of the MTJ. For example, for a TT-sized MTJ, the MTJ switching current generated as a result of the fixed supply voltage to switch the magnetization state of the MTJ to a low state (e.g., AP to P state) (Iswl) is higher for a fast access transistor (WL fast Iswl), than for a typical access transistor (WL TT Iswl) and a slow access transistor (WL slow Iswl). Similarly, for a TT-sized MTJ, the MTJ switching current generated as a result of the fixed supply voltage to switch the magnetization state of the MTJ to a high state (e.g., P to AP state) (Iswh) is higher for a fast access transistor (WL fast Iswh), than for a typical access transistor (WL TT Iswh) and a slow access transistor (WL slow Iswh). The current switching margin is the difference between the actual MTJ switching current generated as a result of the fixed supply voltage applied to the MRAM bit cell and a designed or specified switching current, which is shown as dashed lines Iswh_s and Iswl_s for switching the MTJ to a high state and a low state, respectively. If the switching current margin is too high, the access transistors in the MRAM bit cell can be come overstressed and fail. However, if the switching current margin is too low, write operations may fail, thus resulting in increased bit errors and reduced reliability.

Thus, IC designs that include MRAM may employ a fixed supply voltage with a larger corner overhead to cover for logic process variations that can vary the MTJ switching current. A larger corner overhead can be provided in the fixed supply voltage Vdd applied to MRAM to ensure that the current switching margin is sufficient for write operations to account for process variations of the access transistors. However, a larger fixed supply voltage Vdd may overstress certain MTJs based on their actual process corner variation and still damage gate oxides of access transistors. However, if the fixed supply voltage Vdd is not increased to provide a sufficient switching current margin to account for process variations of the access transistors, the current switching margin that may fall outside of specifications leading to increased bit yield errors.

Alternatively, the process variations that affect the access transistors may be determined to control the supply voltage to provide a sufficient current switching margin based on the access transistor performance without overstressing the access transistor. However, as also shown in FIG. 2A, the size of the MTJ also affects the MTJ switching current generated as a result of the fixed supply voltage to switch the magnetization state of the MTJ to a low state (e.g., AP to P state) (Iswl) and a high state (e.g., AP to P state). A larger-sized MTJ has a lower resistance than a smaller-sized MTJ. Thus, as shown in the graph 200A in FIG. 2A, for a given fixed supply voltage Vdd applied to an MRAM bit cell, the MTJ switching current will be larger for a larger-sized MTJ (e.g., +20%) than a typical-sized MTJ, and a smaller-sized MTJ (e.g., −20%). Process variations that occur in the fabrication of MTJs can vary the size of the MTJ and thus affect the MTJ switching current generated as a result of the fixed supply voltage Vdd across an MRAM bit cell. For example, for a larger-sized MTJ, the MTJ switching current generated as a result of the fixed supply voltage to switch the magnetization state of the MTJ for a given state is higher than for a smaller-sized MTJ. Thus, even accounting for process variations in the access transistors to control the supply voltage Vdd applied to the MRAM bit cells may not provide a sufficient current switching margin to reduce or avoid bit errors without overstressing the access transistors.

Similarly, ambient temperature can influence current switching margin by influencing the switching speed and on-state current of a transistor. For example, a low ambient temperature can cause an access transistor of an MRAM bit cell to have a low reactance and a low resistance between the source and the drain (i.e., a low impedance). In this manner, the access transistor at the low ambient temperature can have a fast switching speed. Therefore, in order to keep the frequency and current of the access transistor substantially constant at the low ambient temperature, the supply voltage applied to the MRAM bit cell can be reduced. Conversely, a relatively higher ambient temperature can cause the access transistor to have a higher impedance, and therefore have a slower switching speed. Thus, increasing the supply voltage can regulate the frequency and current of the access transistor at higher ambient temperatures. However, as voltage increases, so does the energy of the charge carriers flowing across the access transistor, which can cause tunneling at the gate oxide of the access transistor. Such increases in tunneling can damage the gate oxide of the access transistor through mechanisms such as time-dependent dielectric breakdown. An access transistor with a faster switching speed can also increase the energy of the charge carriers. Since a faster switching speed can be induced by a lower ambient temperature, an access transistor at a lower ambient temperature might require a lower supply voltage in order to reduce the write current to the designed critical switching current (i.e., provide the designed current switching margin). If the supply voltage is not lowered and the designed critical switching current is exceeded, power consumption can become inefficient and the tunnel barrier can become overstressed by the write process.

Ambient temperature variations can also lead to variations in the energy barrier of MTJs in MRAM bit cells. For example, FIG. 2B is a graph 200B illustrating how ambient temperature can influence the energy barrier of an MTJ in an MRAM bit cell, such as the STT-MTJ device 100 in the MRAM bit cell 102 illustrated in FIG. 1. The graph 200B illustrates two exemplary pulse width curves (250 nanoseconds (ns) and 10 ns) for conducting write operations to MTJs in MRAM bit cells in MRAM at varying ambient temperatures. Each pulse width curve in FIG. 2B illustrates the amount of time and current that can be required to conduct a write operation at a given temperature. For example, the 250 ns pulse width curve illustrates applying a write current across an MTJ in an MRAM bit cell for 250 ns at −30 degrees Celsius (° C.), 25° C., and 70° C. The 10 ns pulse width curve illustrates applying a write current across an MTJ in an MRAM bit cell in MRAM for 10 ns at the same temperature intervals. As shown in the graph 200B, performing a write operation at low ambient temperatures (i.e., a cold environment) can require a higher write current. For example, as illustrated in FIG. 2B, the write current required to perform a write operation to an MTJ in an MRAM bit cell for a pulse width of 10 ns at −30° C. is six percent (6%) greater (i.e., 1.06) than the write current required to perform a write operation for the pulse width of 10 ns at 70° C. (i.e., 1.00). The 250 ns pulse width curve illustrated in FIG. 2B shows a similar relationship, wherein the write current required to perform a write operation for a pulse width of 250 ns at −30° C. is approximately 5% greater than the write current required at 70° C. (i.e., 1.05).

Figure 2B:
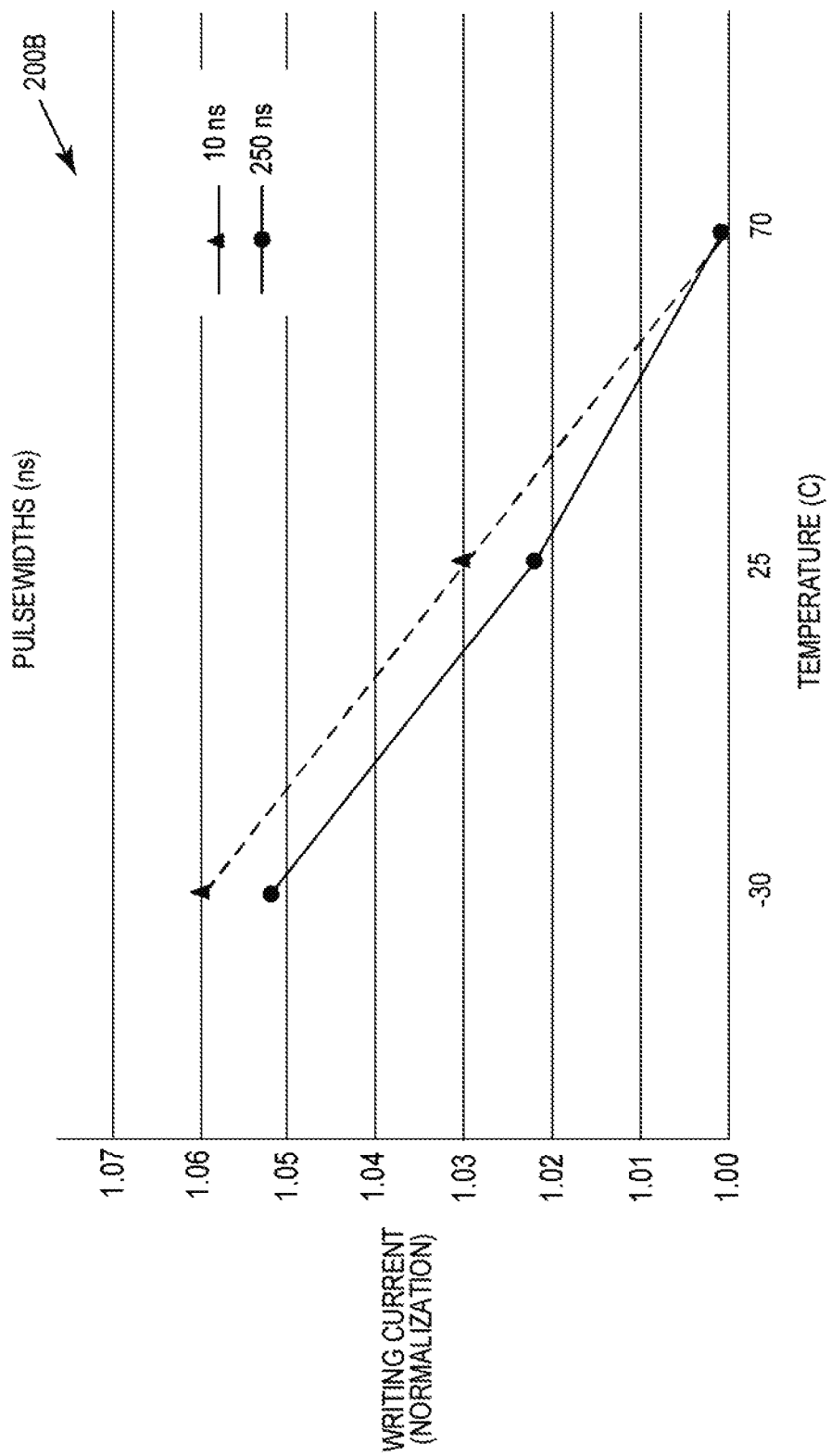
FIG. 2B is a graph illustrating exemplary switching current levels for writing to MRAM bit cells at varying pulse widths to account for varying ambient temperatures to reduce writing current margin at low ambient temperatures without risking additional bit errors.

The graph 200B in FIG. 2B also illustrates how varying pulse widths can influence the amount of write current required to perform a write operation. For example, at −30° C., the 250 ns pulse width curve requires less write current to perform a write operation than the 10 ns pulse width curve. This is because increasing the amount of time a current is applied to an MTJ in an MRAM bit cell (i.e., increasing the pulse width) increases the amount of energy transferred to the MTJ. Since switching a magnetization state of an MTJ requires transferring a certain amount of energy to the MTJ—an amount of energy known as an "energy barrier" of an MTJ—increasing the pulse width of a write operation allows for a reduced write current relative to a shorter pulse width. An increased pulse width, such as a pulse width greater than 10 ns for example, may reduce the energy barrier, and thus increase the thermal effect of the write current of the write operation on the MTJ. This can reduce the switching current needed to switch the magnetization state of the MTJ. However, a reduced pulse width, such as a pulse width less than 10 ns for example, may require an exponentially increasing switching current to change the magnetization state of the MTJ, because a reduced pulse width may have little to no thermal effect on the MTJ. Thus, an MTJ having a higher energy barrier requires either an increased write current or a longer pulse width to switch the magnetization state of the MTJ in the MRAM bit cell relative to an MTJ having a lower energy barrier.

Ambient temperature can also influence the energy barrier of an MTJ. For example, low ambient temperatures (i.e., cold temperatures) can increase the energy barrier of an MTJ. This is the reason why the pulse width curves (10 ns and 250 ns) illustrated in the graph 200B require greater write currents to perform write operations at lower temperatures. In this manner, lower ambient temperatures can also lead to increased impedance in MTJs. For example, an AP MTJ at a low ambient temperature can have a higher energy barrier, and thus a higher impedance, than an AP MTJ at a relatively higher ambient temperature. This increase in impedance occurs because more energy is required to switch a cold MTJ from an AP state to a P state than a relatively hot MTJ from an AP state to a P state. Therefore, AP MTJs in MRAM bit cells at low ambient temperatures may require a higher critical switching current and thus a higher switching voltage to switch the state of the MRAM bit cell from an AP state to a P state than at higher ambient temperatures. In this regard, if the switching current and/or switching voltage margin is too high, the MTJs in the MRAM can be overstressed and risk damaging the access transistors. However, if the switching current and/or switching voltage margin is too low, write operations may result in bit errors and reduced reliability.

Thus, in exemplary aspects disclosed herein, process variations in the fabrication of MTJ devices in MRAM bit cells that affect MTJ resistance, and thus can affect the switching current for write operations, are determined. Process variations that can affect performance of access transistors employed in MRAM bit cells are also determined. Further, ambient temperatures at MRAM bit cells that can lead to operational variations in both the resistance of MTJs and the switching speed of access transistors are determined. These measured process variations and ambient temperatures in the MTJs and access transistors are used to dynamically control a supply voltage for write operations to the MRAM. In this manner, the switching current and/or switching voltage for write operations can be dynamically increased to account for switching current margins that are too low based on the effect of process variations occurring in both the access transistor and the MTJ and ambient temperature at the MTJ in the MRAM bit cell, thus reducing the likelihood of bit errors. Further, the switching current for write operations can also be dynamically decreased to account for switching current margins that are too high based on the effect of process variations occurring in both the access transistor and the MTJ and ambient temperature at the MTJ in the MRAM bit cell, thus reducing power consumption and the need for design overhead, and the risk of damaging MRAM bit cells due to voltage stress.

Figure 3A:
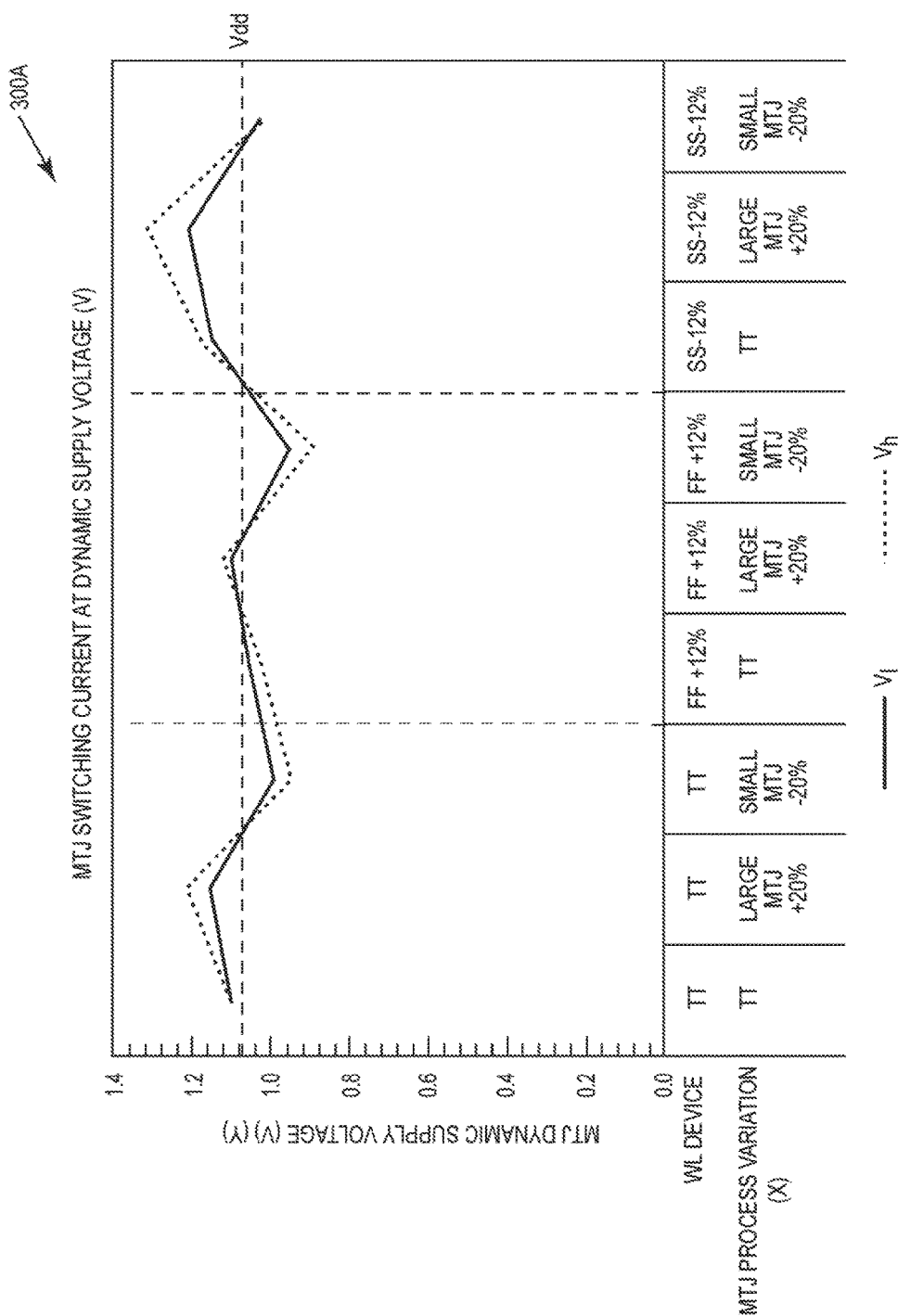
FIG. 3A is a graph illustrating an exemplary supply voltage dynamically generated by a supply voltage for conducting write operations to MRAM bit cells in MRAM to account for different combinations of MTJ process variations and access transistor process variations to reduce switching current margin without risking additional bit errors.

In this regard, FIG. 3A is a graph 300A illustrating exemplary MTJ dynamic supply voltage (V) dynamically generated by a supply voltage for conducting write operations to MRAM bit cells in MRAM to account for different combinations of MTJ process variations and access transistor process variations to reduce switching current margin without risking additional bit errors. The MTJ dynamic supply voltage (V) is shown for both low-state (Vl) and high-state (Vh) write operations. The dynamically-generated MTJ dynamic supply voltage (V) is shown on the Y-axis for a given MTJ process variation that accounts for both process variations in the access transistor (labeled "WL DEVICE") and the MTJ (labeled "MTJ PROCESS VARIATION") shown on the X-axis. Dynamically generating the MTJ dynamic supply voltage (V) for MTJ write operations is opposed to only generating a single, fixed supply voltage for MTJ operations, which is shown as voltage Vdd in the graph 300A.

Thus, for example, as shown in the graph 300A, for a typical-typical (TT) access transistor, the MTJ dynamic supply voltage (V) can be increased if measured process variation of the MTJ indicates a larger MTJ having a lower resistance, and decreased if measured process variation of the MTJ indicates a smaller MTJ having a higher resistance. The MTJ dynamic supply voltage (V) may need to be increased for a larger MTJ having a lower resistance for a given access transistor performance because a larger MTJ may require a larger switching current to change magnetization states. The increase in the MTJ dynamic supply voltage (V) may still be less than would otherwise be provided if the MTJ process variation was not measured to account for a worst-case current switching margin. Similarly, the MTJ dynamic supply voltage (V) may need to be decreased for a smaller MTJ having a higher resistance for a given access transistor performance because a smaller MTJ may require less switching current to change magnetization states. As another example shown in the graph 300A, for a slow (SS) access transistor, the MTJ dynamic supply voltage (V) may need to be increased over a typical-typical (TT) access transistor for a given MTJ size, because the SS access transistor cannot drive as much current as the typical-typical (TT) access transistor. As yet another example shown in the graph 300A, for a fast (FF) access transistor, the MTJ dynamic supply voltage (V) may need to be decreased over a typical-typical (TT) access transistor for a given MTJ size, because the FF access transistor can drive more write current for a given supply voltage than the TT and SS access transistors.

Figure 3B:
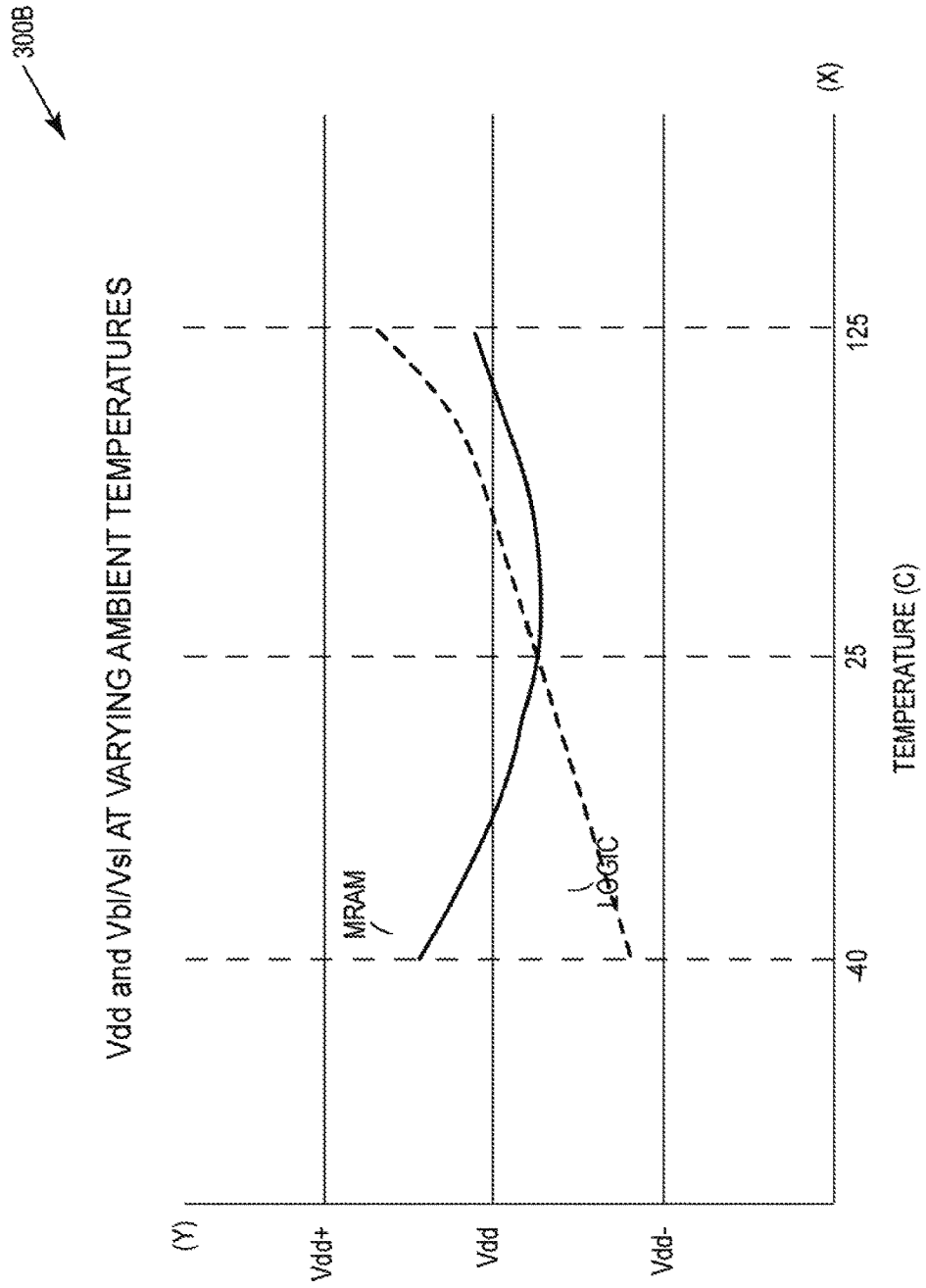
FIG. 3B is a graph illustrating exemplary voltage levels for writing to MRAM bit cells to account for variations in ambient temperature to reduce writing current margin at lower ambient temperatures without risking additional bit errors.

FIG. 3B shows a graph 300B illustrating exemplary MTJ dynamic supply voltage (V) dynamically generated by a supply voltage for conducting write operations to MRAM bit cells in MRAM to account for varying ambient temperatures at an MRAM bit cell to reduce switching current margin without risking additional bit errors. The MTJ dynamic supply voltage (V) is shown as a bit line to source line voltage (Vbl/Vsl) for an MTJ in an MRAM bit cell. The dynamically-generated MTJ dynamic supply voltage (Vdd) is shown on the Y-axis (Y) for a given ambient temperature shown on the X-axis (X). In this regard, ambient temperature at both the access transistor (labeled "LOGIC") and the MTJ (labeled "MRAM") is accounted for in the LOGIC curve and the MRAM curve, respectively, in the graph 300B. Dynamically generating the MTJ dynamic supply voltage (V) for MTJ write operations is opposed to only generating a single, fixed supply voltage for MTJ operations, which is shown as voltage Vdd in the graph 300A in FIG. 3A.

Thus, for example, as shown in the graph 300B in FIG. 3B, for an MTJ at −40° C., the MTJ dynamic supply voltage (V) can be increased because the measured ambient temperature at the MRAM bit cell indicates a low ambient temperature. Conversely, for an access transistor at 25° C., the MTJ dynamic supply voltage (V) can be decreased because the measured ambient temperature at the MRAM bit cell indicates a relatively higher ambient temperature. The MTJ dynamic supply voltage (V) may need to be increased at a lower ambient temperature because a lower ambient temperature may require a larger switching current and/or switching voltage to change magnetization states. The increase in the MTJ dynamic supply voltage (V) may still be less than would otherwise be provided if the MTJ ambient temperature was not measured to account for a worst-case current switching margin. Similarly, the MTJ dynamic supply voltage (V) may need to be decreased for a relatively higher ambient temperature at the MRAM bit cell because a higher ambient temperature, such as 25° C. for example, at the MRAM bit cell may require less switching current to change magnetization states. MTJ dynamic supply voltage (V) can be increased if the measured ambient temperature indicates a lower ambient temperature at the MRAM bit cell, and decreased if the measured ambient temperature indicates a higher ambient temperature at the MRAM bit cell. As another example shown in the graph 300B, for an access transistor at a higher ambient temperature, the dynamic supply voltage (V) may need to be increased because the access transistor cannot drive as much current at a higher ambient temperature. As yet another example shown in the graph 300B, for an access transistor, the dynamic supply voltage (V) may need to be decreased because the access transistor can drive more write current for a given supply voltage at a lower ambient temperature than the access transistor can at a higher ambient temperature.

Thus, in summary, as shown in the graph 300A in FIG. 3A, by determining the MTJ process variations for a given access transistor performance at an MRAM bit cell, the MTJ dynamic supply voltage (V) can be decreased for smaller-sized MTJs and increased for larger-sized MTJs. Further, as shown in the graph 300A, by determining the logic process variations affecting access transistor performance, for a given MTJ size, the MTJ dynamic supply voltage (V) can be increased for slower access transistors and decreased for faster access transistors. Similarly, as shown in the graph 300B in FIG. 3B, by determining the ambient temperature at an MRAM bit cell, the MTJ dynamic supply voltage (V) can be increased for lower ambient temperatures and increased for relatively higher ambient temperatures at MRAM bit cells. Further, as shown in the graph 300B, by determining the ambient temperature affecting access transistor performance, for a given ambient temperature, the MTJ dynamic supply voltage (V) can be increased for higher ambient temperatures and decreased for lower ambient temperatures to keep same drive current. In this manner, the switching current for MTJ write operations can be dynamically increased to account for process variations and ambient temperatures in the access transistors and MTJs that would otherwise cause switching current margins to be lower than design specifications for a fixed supply voltage, thus reducing the likelihood of bit errors. Further, the switching current for write operations can also be dynamically decreased to account for process variations in the access transistors and MTJs and ambient temperatures in an MRAM bit cell that would otherwise cause switching current margin to be higher than design specifications, thus reducing power consumption and the need for design overhead, and the risk of damaging MRAM bit cells due to voltage stress.

Figure 4:
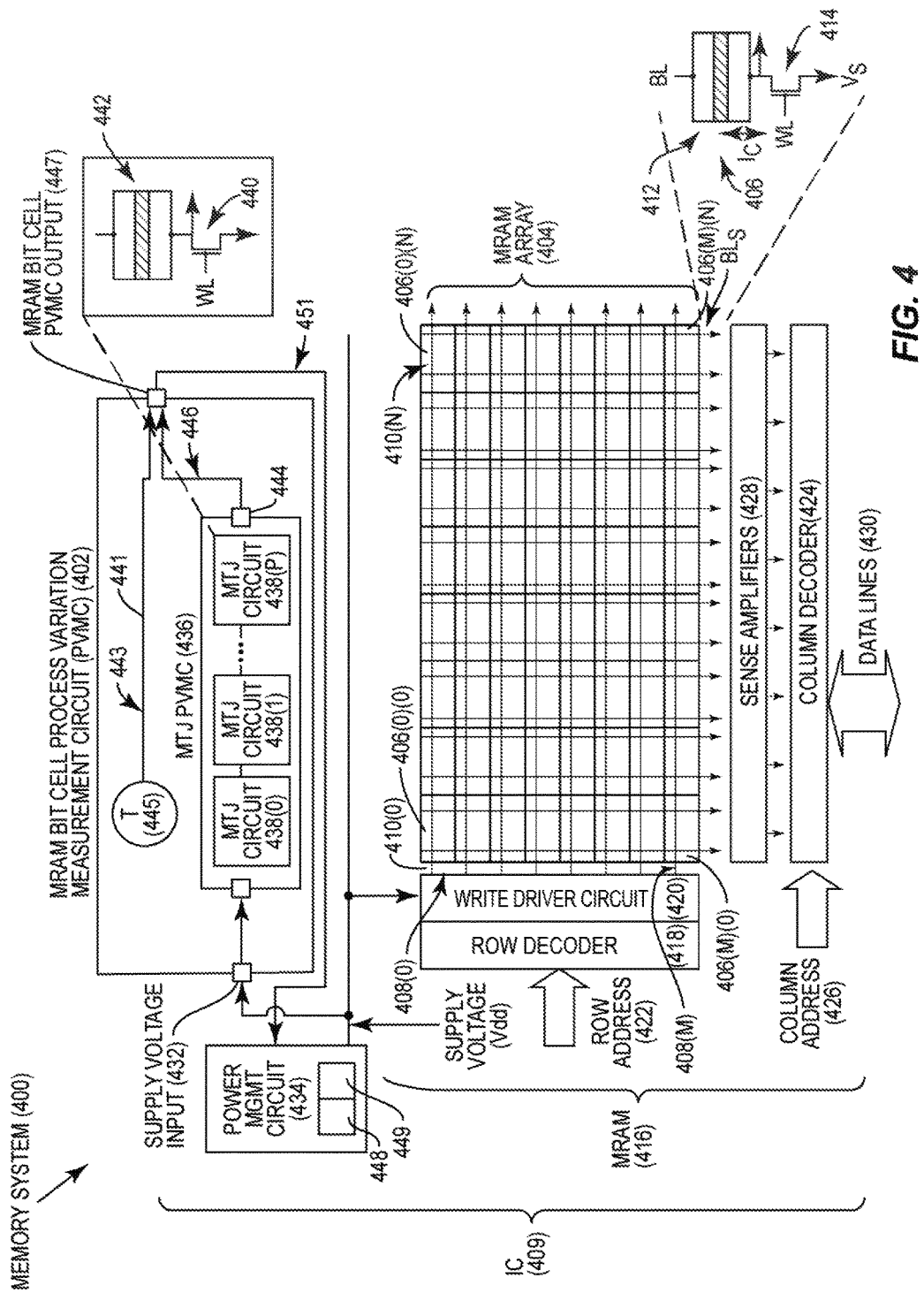
FIG. 4 is a schematic diagram of an exemplary memory system that includes an exemplary MRAM bit cell process variation measurement circuit (PVMC) configured to determine process variations and ambient temperature in an MRAM array, which can be used by a power management circuit to dynamically control a supply voltage provided to the MRAM array for access operations to account for such process variations and ambient temperature.

FIG. 4 is a schematic diagram of an exemplary memory system 400 that includes an exemplary MRAM bit cell PVMC 402. As will be discussed in more detail below, the MRAM bit cell PVMC 402 is configured to determine MTJ process variations and ambient temperature representing MTJ process variations and ambient temperature in MRAM bit cells in an MRAM array 404. The determined MTJ process variations and ambient temperatures in the MRAM array 404 can be used to dynamically control a supply voltage Vdd supplied to the MRAM array 404 for operation to provide a sufficient switching current for write operations while avoiding overstressing the MRAM array 404.

In this regard, the MRAM array 404 includes a plurality of MRAM bit cells 406(0)(0)-406(M)(N) to store data, wherein the MRAM bit cells 406(0)(0)-406(M)(N) are organized in M rows 408(0)-408(M) and N columns 410(0)-410(N). The MRAM bit cells 406(0)(0)-406(M)(N) may each include an MTJ device 412 coupled to an access transistor 414 similar to the STT-MTJ device 100 in FIG. 1, for example. The MRAM array 404 is provided as part of an MRAM 416 that includes supporting circuitry to support read and write operations to the MRAM bit cells 406(0)(0)-406(M)(N). This supporting circuitry includes a row decoder 418 configured to activate a word line driver in a write driver circuit 420 to generate a word line (WL) to select a row of the MRAM bit cells 406(0)(0)-406(M)(N) based on a row address 422 for a memory access request. A column decoder 424 is provided that is configured to select a column of the MRAM bit cells 406(0)(0)-406(M)(N) in the MRAM array 404 based on a column address 426. The selected ones of the MRAM bit cells 406(0)(0)-406(M)(N) are those intersecting the selected row and the selected column by the row decoder 418 and the column decoder 424, respectively. In a read operation, sense amplifiers 428 sense (i.e., read) a storage state of the selected MRAM bit cells 406(0)(0)-406(M)(N) from the respective bit lines (BLs) to provide the read data from the selected MRAM bit cells 406(0)(0)-406(M)(N) onto data lines 430.

With continuing reference to FIG. 4, read and write operations are performed by applying a supply voltage Vdd to the selected MRAM bit cells 406(0)(0)-406(M)(N), which in turn causes the access transistors 414 in the selected MRAM bit cells 406(0)(0)-406(M)(N) to drive a switching current Ic through their respective MTJ devices 412 for performing read and write operations. Process variations in the fabrication of the MRAM bit cells 406(0)(0)-406(M)(N) can lead to variations in both the resistance of their MTJ devices 412 and the switching speed of their access transistors 414. Similarly, ambient temperature variations at the MRAM bit cells 406(0)(0)-406(M)(N) can lead to variations in both the resistance of their MTJ devices 412 and the switching speed of their access transistors 414. At a fixed supply voltage Vdd, these process variations and ambient temperatures can result in generation of the switching current Ic that is too low to reliably write a state to the MTJ devices 412. In response, a fixed supply voltage Vdd with a larger corner overhead could be provided to power the MRAM 416 to account for process variations and ambient temperatures that can vary switching current Ic to provide a desired switching current margin. However, if the switching current margin is too high, the MTJ devices 412 of the selected MRAM bit cells 406(0)(0)-406(M)(N) in the MRAM 416 may be overstressed and risk damaging their access transistors 414. However, if the switching current margin is too low, write operations may result in bit errors in the selected MRAM bit cells 406(0)(0)-406(M)(N) and reduce reliability.

In this regard, the MRAM bit cell PVMC 402 includes a supply voltage input 432 configured to receive the supply voltage Vdd generated by a power management circuit 434 in this example. The power management circuit 434 is configured to generate the supply voltage Vdd to provide power to consuming components of an IC 409 for operation, including the MRAM 416. The power management circuit 434 may be configured to adaptively control the voltage level of the supply voltage Vdd based on power consumption modes and/or performance parameters of the IC 409. In this example, the MRAM bit cell PVMC 402 includes an MTJ PVMC 436 coupled to the supply voltage input 432. In this manner, the MTJ PVMC 436 is powered by the same supply voltage Vdd as the MRAM array 404 so that the MTJ PVMC 436 can experience similar delay variations as a function of voltage. The MTJ PVMC 436 also includes one or more MTJ circuits 438(0)-438(P) configured to be powered by the supply voltage Vdd from the supply voltage input 432. As shown in FIG. 4, the MTJ circuits 438(0)-438(P) each include a measurement transistor 440 of a MOS type of an access transistor 414 included in at least one of the MRAM bit cells 406(0)(0)-406(M)(N) in the MRAM array 404. The MTJ circuits 438(0)-438(P) also each include a measurement MTJ device 442 of a type of an MTJ device 412 included in at least one of the MRAM bit cells 406(0)(0)-406(M)(N) in the MRAM array 404. Because the MTJ circuits 438(0)-438(P) are fabricated on the same die being part of the same IC 409 in this example, the measurement transistor 440 and the measurement MTJ device 442 will have the same or similar global process variations as in the access transistor 414 and the MTJ device 412 of the MRAM bit cells 406(0)(0)-406(M)(N). Thus, the performance of the MTJ circuits 438(0)-438(P) can be measured to represent the process variations in the MRAM bit cells 406(0)(0)-406(M)(N) in the MRAM array 404, because the MTJ circuits 438(0)-438(P) should experience the same or similar performance delay as the MRAM bit cells 406(0)(0)-406(M)(N).

As an example, the measurement transistor 440 and the measurement MTJ device 442 in the MTJ circuits 438(0)-438(P) may also have the same or similar local process variations as in the access transistor 414 and MTJ device 412 of the MRAM bit cells 406(0)(0)-406(M)(N) depending on the layout location of the MTJ PVMC 436 relative to the MRAM array 404. For example, process variations in the fabrication of the MTJ device 412 may be a global process variation that varies the size of its stack layers in both the MTJ devices 412 in the MRAM bit cells 406(0)(0)-406(M)(N) as well as the measurement MTJ devices 442 in the MTJ circuits 438(0)-438(P). Generally, the larger the MTJ size, the lower its resistance, and vice versa—the smaller the MTJ size, the higher its resistance. Thus, for a given supply voltage Vdd applied across an MTJ circuit 438(0)-438(P), the switching current Ic will decrease for a smaller-sized measurement MTJ device 442 due to its lower energy barrier. The switching current Ic will increase for a larger-sized measurement MTJ device 442 due to its higher energy barrier.

Thus, with continuing reference to FIG. 4, the MTJ PVMC 436 includes an MTJ PVMC output 444 coupled to the MTJ circuits 438(0)-438(P). The MTJ PVMC 436 is configured to generate, on the MTJ PVMC output 444, a process variation measurement voltage signal 446 indicating process variation in the measurement transistors 440(0)-440(P) and process variation in the measurement MTJ devices 442(0)-442(P) of the MTJ circuits 438(0)-438(P). This measured process variation in the measurement transistors 440(1)-440(P) and process variation in the measurement MTJ devices 442(1)-442(P) of the MTJ circuits 438(1)-438(P) represents the process variation in the MRAM bit cells 406(0)(0)-406(M)(N) in the MRAM array 404, as a function of the supply voltage Vdd coupled to the MTJ PVMC 436. For example, the MTJ PVMC 436 may be configured to control the amplitude or frequency of the process variation measurement voltage signal 446 as a function of process variation in the measurement MTJ devices 442(0)-442(P) of the MTJ circuits 438(0)-438(P), representing process variation in the MRAM bit cells 406(0)(0)-406(M)(N) in the MRAM array 404. The MTJ PVMC output 444 is coupled to an MRAM bit cell PVMC output 447. In this manner, the power management circuit 434, which is coupled to the MRAM bit cell PVMC output 447, is configured to receive the process variation measurement voltage signal 446 from the MRAM bit cell PVMC 402.

The MRAM bit cell PVMC 402 also includes an ambient temperature input 441 configured to receive an ambient temperature measurement voltage signal 443 representing ambient temperature at the MRAM bit cells 406(0)(0)-406(M)(N). With regard to FIG. 4, the ambient temperature input 441 is coupled to an ambient temperature sensor 445 included in the MRAM bit cell PVMC 402. The ambient temperature sensor 445 is configured to generate the ambient temperature measurement voltage signal 443 representing ambient temperature at the MRAM bit cells 406(0)(0)-406(M)(N) and transmit the ambient temperature measurement voltage signal 443 to the ambient temperature input 441. The ambient temperature input 441 is coupled to the MRAM bit cell PVMC output 447. The MRAM bit cell PVMC output 447 can include a multiplexing circuit, a logic circuit for generating a signal based on the ambient temperature measurement voltage signal and/or the process variation measurement voltage signal, or be coupled to a bus for transmitting both the ambient temperature measurement voltage signal 443 and the process variation measurement voltage signal 446 to the power management circuit 434. Similar logic circuits for transmitting the ambient temperature measurement voltage signal 443 and the process variation measurement voltage signal 446 to the power management circuit 434 may also be used. In examples described herein, at least one MRAM bit cell PVMC output voltage signal 451 is provided representing at least one of the process variation of at least one MRAM bit cell in the MRAM array as a function of the supply voltage coupled to the MRAM bit cell PVMC, and the ambient temperature at the at least one MRAM bit cell in the MRAM array. In this manner, the power management circuit 434 is configured to receive the ambient temperature measurement voltage signal 443 from the MRAM bit cell PVMC 402.

The power management circuit 434 is configured to determine a supply voltage level for the supply voltage Vdd based on the received process variation measurement voltage signal 446 and the received ambient temperature measurement voltage signal 443. The power management circuit 434 is further configured to dynamically generate the supply voltage Vdd at the determined supply voltage level. As will be discussed in more detail below, the power management circuit 434 may include a memory 448 configured to store parameters indicative of the MTJ process variation of the MRAM bit cells 406(0)(0)-406(M)(N) and the ambient temperature at the MRAM bit cells 406(0)(0)-406(M)(N) that can then be used to determine the supply voltage level to generate the supply voltage Vdd. As another example, the power management circuit 434 may include a counter 449 that is updated based on the received pulses in the received process variation measurement voltage signal 446, wherein the counter 449 can be reviewed as a function of time.

For example, if the effect of the determined process variations in the MRAM bit cells 406(0)(0)-406(M)(N) based on the received process variation measurement voltage signal 446 is that switching current Ic for a write operation will be reduced for a given supply voltage Vdd, the power management circuit 434 can dynamically increase the supply voltage Vdd to account for the switching current margins being too low, thus reducing the likelihood of bit errors. However, if the effect of the determined process variations in the MRAM bit cells 406(0)(0)-406(M)(N) based on the received process variation measurement voltage signal 446 is that switching current Ic for a write operation will be increased for a given supply voltage Vdd due to increased MTJ resistance, the power management circuit 434 can dynamically decrease the supply voltage Vdd to account for switching current margins that would otherwise be high enough to risk damaging the MRAM bit cells 406(0)(0)-406(M)(N) due to voltage stress. Further, dynamically controlling the supply voltage Vdd supplied to the MRAM array 404 reduces the need to provide for supply voltage overhead, thus reducing power consumption.

Figure 5:
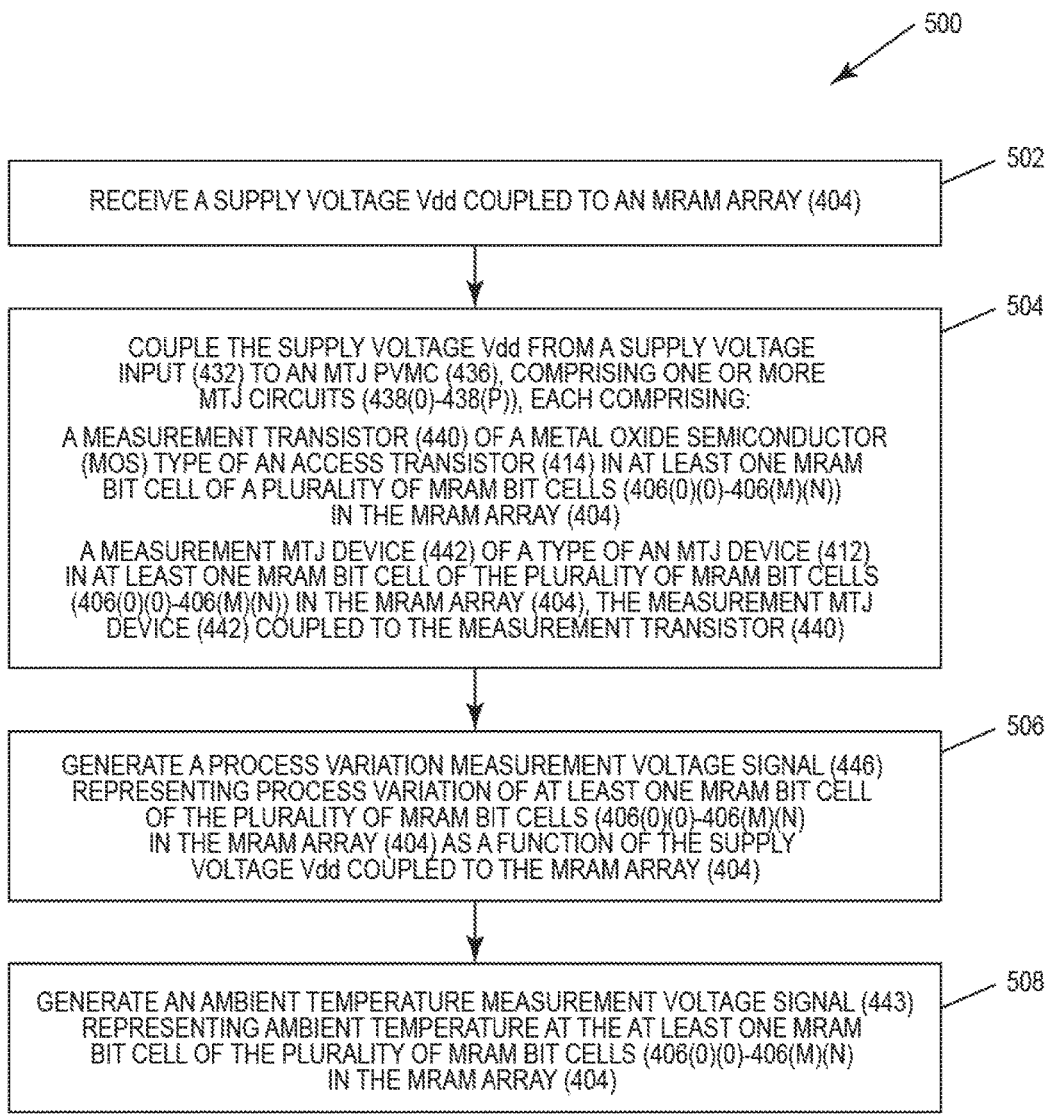
FIG. 5 is a flowchart illustrating an exemplary process that can be performed by the memory system in FIG. 4 for determining process variations and ambient temperature in an MRAM array and dynamically controlling a supply voltage provided to the MRAM array for access operations to account for such process variations and ambient temperature.

FIG. 5 is a flowchart illustrating an exemplary process 500 that can be performed by the memory system 400 in FIG. 4 for determining MTJ process variations and ambient temperature in the MRAM array 404 and dynamically controlling the supply voltage Vdd provided to the MRAM array 404 for write operations to account for such process variations and ambient temperature. The MRAM bit cell PVMC 402 receives the supply voltage Vdd coupled to the MRAM array 404 on the supply voltage input 432 (block 502). The received supply voltage Vdd from the supply voltage input 432 is coupled to the MTJ PVMC 436, which includes the MTJ circuits 438(0)-438(P) (block 504). Each of the MTJ circuits 438(0)-438(P) includes a measurement transistor 440 of a MOS type of an access transistor 414 in at least one of the MRAM bit cells 406(0)(0)-406(M)(N) in the MRAM array 404 (block 504). Each of the MTJ circuits 438(0)-438(P) also includes a measurement MTJ device 442 of a type of an MTJ device 412 in at least one of the MRAM bit cells 406(0)(0)-406(M)(N) in the MRAM array 404, wherein the measurement MTJ device 442 is coupled to the measurement transistor 440 (block 504). The MTJ PVMC 436 is configured to generate the process variation measurement voltage signal 446 representing process variation of an access transistor 414 and an MTJ device 412 in the at least one MRAM bit cell 406(0)(0)-406(M)(N) in the MRAM array 404, as a function of coupling the supply voltage Vdd to the MTJ circuits 438(0)-438(P) (block 506). The MTJ PVMC 436 is configured to generate the ambient temperature measurement voltage signal 443 representing ambient temperature at the at least one MRAM bit cell 406(0)(0)-406(M)(N) in the MRAM array 404 (block 508).

Figure 6:
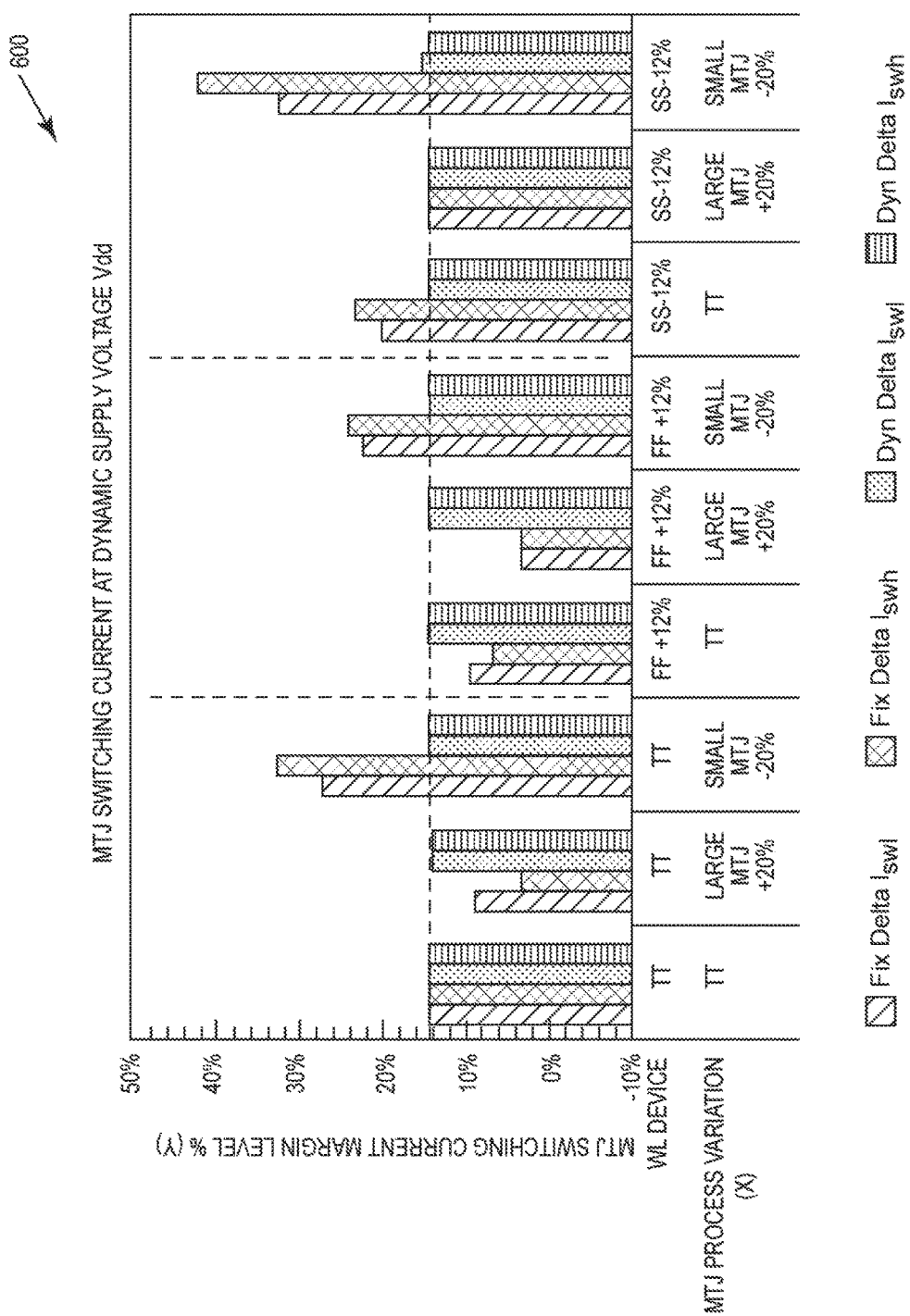
FIG. 6 is a graph illustrating an exemplary comparison of switching current margin level percentage deviations for write operations to the MRAM bit cells in the MRAM array in FIG. 4 at a fixed and dynamic supply voltage for different combinations of MTJ and access transistor process variations.

FIG. 6 is a graph 600 illustrating an exemplary comparison of switching current margin level percentage deviations for write operations to the MRAM bit cells 406(0)(0)-406(M)(N) in the MRAM array 404 in FIG. 4 at a fixed and dynamic supply voltage Vdd for different combinations of the MTJ device 412 and access transistor 414 process variations in the MRAM bit cells 406(0)(0)-406(M)(N). As shown in FIG. 6, the MTJ switching current margin percentage (%) is shown on the Y-axis for a given MTJ process variation that accounts for both process variations in the access transistor (labeled "WL DEVICE") and the MTJ (labeled "MTJ PROCESS VARIATION") shown on the X-axis. The MTJ switching current margin percentage (%) for a fixed supply voltage Vdd that is not dynamically controlled based on MTJ process variation is shown as bar graphs labeled "Fix Delta Iswl" and "Fix Delta Iswh" for switching to P and AP states, respectively. The MTJ switching current margin percentage (%) for a supply voltage Vdd that is dynamically controlled by the power management circuit 434 based on the process variation measurement voltage signal 446 as a function of MTJ process variation in the MRAM bit cells 4060(0)-406(M)(N) is shown as bar graphs labeled "Dyn Delta Iswl" and "Dyn Delta Iswh," for switching to P and AP states, respectively. As shown, the MTJ switching current margin percentage (%) is substantially the same across all MTJ process variations, because the power management circuit 434 is configured to dynamically adjust the supply voltage Vdd as a function of MTJ process variation to control the switching current Ic to achieve substantially the MTJ switching current margin percentage (%).

As discussed above and illustrated in the memory system 400 in FIG. 4, the MRAM bit cell PVMC 402 includes the MTJ PVMC 436 that includes the MTJ circuits 438(0)-438(P) each including both a measurement transistor 440 and a measurement MTJ device 442 to represent the access transistor 414 and MTJ device 412 in the MRAM bit cells 406(0)(0)-406(M)(N), respectively. Thus, the process variation measurement voltage signal 446 generated by the MTJ PVMC 436 will be a function of the MTJ process variation in the MTJ devices 412 and the access transistors 414 in the MRAM bit cells 406(0)(0)-406(M)(N) in the MRAM array 404. However, as shown in FIG. 6 for example, the switching current Ic generated in the MRAM bit cells 406(0)(0)-406(M)(N) for a write operation is a function of both MTJ process variation and logic process variation. Thus, it may be desired to independently determine the MTJ process variation of the MTJ devices 412 in the MRAM bit cells 406(0)(0)-406(M)(N) separately from the logic process variation of the access transistors 414 in the MRAM bit cells 406(0)(0)-406(M)(N). In this manner, the effect of MTJ process variation on the switching current Ic can be determined and accounted for separately from the logic process variation. As will be discussed in more detail below, separately determining logic process variation from MTJ process variation allows the power management circuit 434 to dynamically adjust the supply voltage Vdd for write operations based on the specific switching state (AP to P or P to AP) for improved current switching margin performance.

Figure 7:
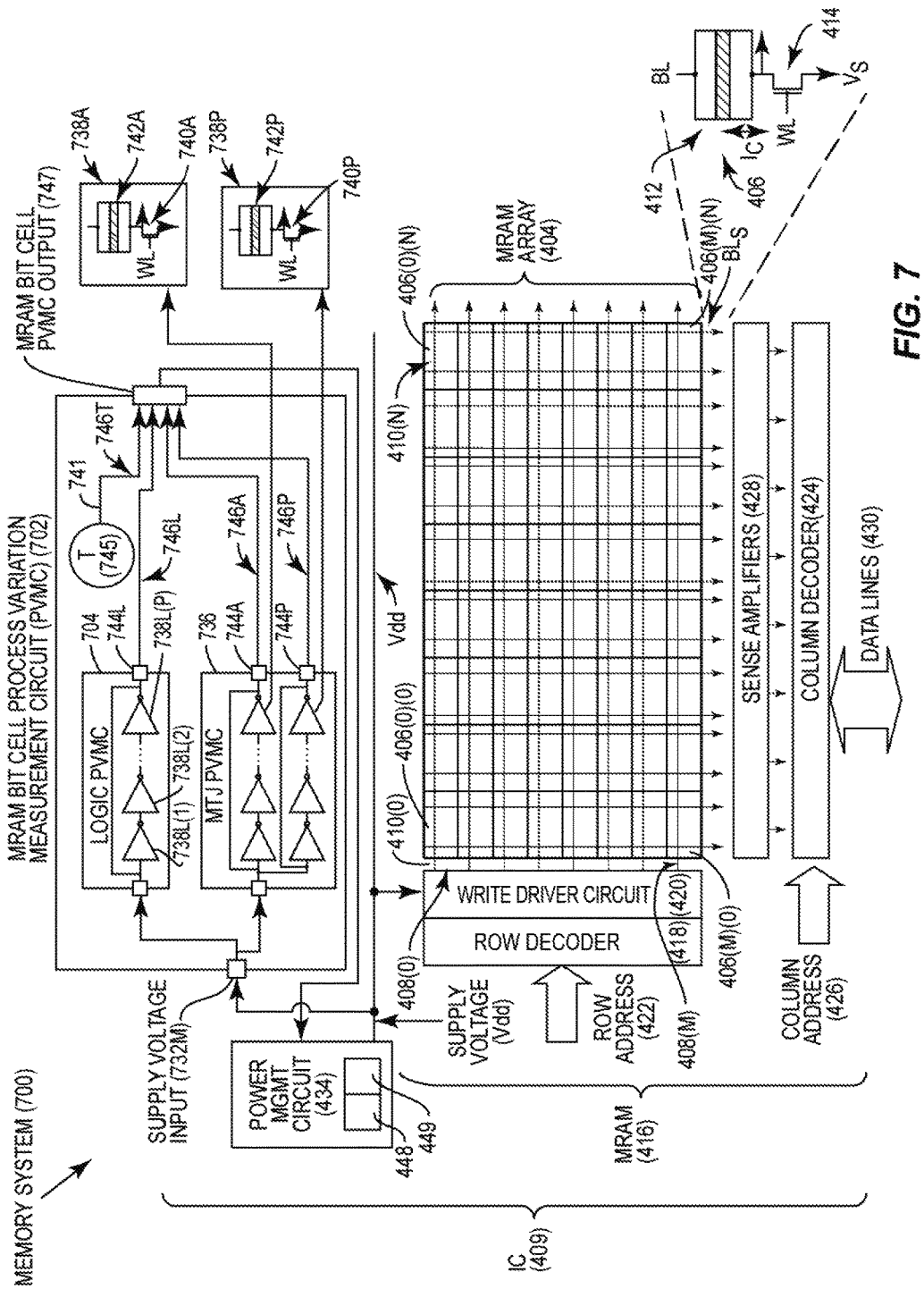
FIG. 7 is a schematic diagram of another exemplary memory system that includes an exemplary MRAM bit cell PVMC disposed in an IC with a separate logic PVMC, MTJ PVMC, and ambient temperature sensor, wherein the MRAM bit cell PVMC is configured to determine MTJ and logic process variations representing MTJ and logic process variations in an MRAM array, and the ambient temperature sensor is configured to determine ambient temperature at the MRAM array.

In this regard, FIG. 7 is a schematic diagram of another exemplary memory system 700. The memory system 700 includes the MRAM 416 and the power management circuit 434 in FIG. 4. Other common components between the memory system 700 in FIG. 7 and the memory system 400 in FIG. 4 are shown with common element numbers in FIGS. 4 and 7, and thus will not be redescribed.

Figure 8:
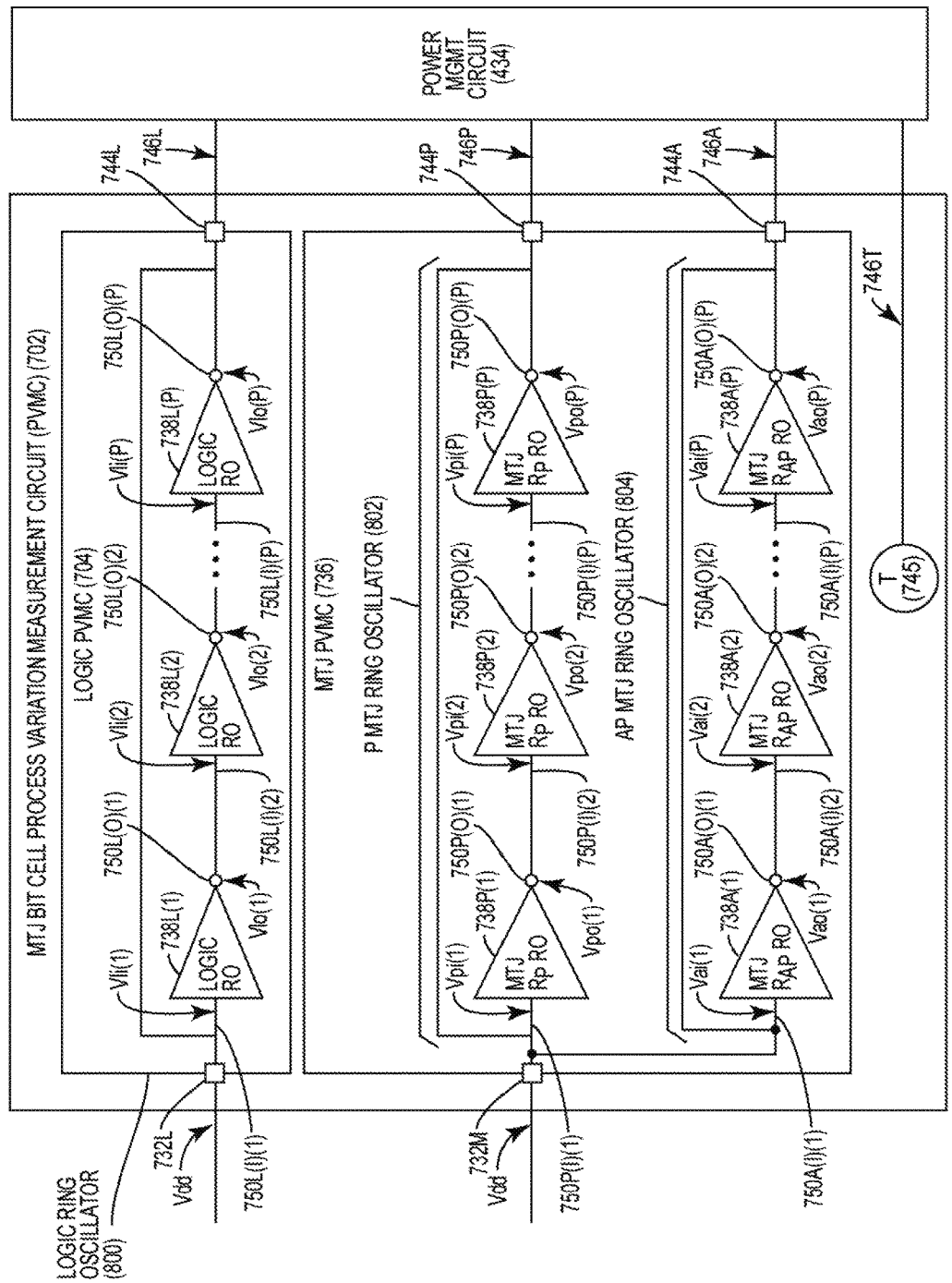
FIG. 8 is a schematic diagram of an exemplary MRAM bit cell PVMC that can be provided in the memory system in FIG. 7, wherein the MRAM bit cell PVMC includes a logic PVMC in the form of a logic ring oscillator circuit configured to measure logic process variations, an MTJ PVMC that includes a parallel (P) MTJ ring oscillator circuit configured to measure MTJ process variations for a P magnetization state and an anti-parallel (AP) MTJ ring oscillator circuit configured to measure MTJ process variations for an AP magnetization state, and an ambient temperature sensor configured to measure ambient temperature.

The memory system 700 in FIG. 7 includes an exemplary MRAM bit cell PVMC 702 (illustrated in further detail in FIG. 8). As will be discussed in more detail below, the MRAM bit cell PVMC 702 in this example includes a logic PVMC 704 that is configured to determine logic process variations representing logic process variations in MRAM bit cells 406(0)(0)-406(M)(N) in the MRAM array 404. The MRAM bit cell PVMC 702 in this example also includes an MTJ PVMC 736 that is configured to determine MTJ process variations representing MTJ process variations in MRAM bit cells 406(0)(0)-406(M)(N) in the MRAM array 404 for both high (P to AP) and low (AP to P) switching states. The MRAM bit cell PVMC 702 in this example also includes an ambient temperature input 741 coupled to an ambient temperature sensor 745. The ambient temperature sensor 745 is configured to generate an ambient temperature measurement voltage signal 746T representing ambient temperature at the MRAM bit cells 406(0)(0)-406(M)(N) and transmit the ambient temperature measurement voltage signal 746T to the ambient temperature input 741. The determined logic and MTJ process variations for the MRAM array 404 and the ambient temperature at the MRAM array 404 can be used to dynamically control a supply voltage Vdd supplied to the MRAM array 404 for operation to provide a sufficient switching current for write operations while avoiding overstressing the MRAM 416.

With continuing reference to FIG. 7, the MRAM bit cell PVMC 702 includes the MTJ PVMC 736 coupled to a supply voltage input 732M. In this manner, the MTJ PVMC 736 is powered by the same supply voltage Vdd as the MRAM array 404 so that the MTJ PVMC 736 can experience similar delay variations as a function of voltage. As shown in FIG. 7, the MTJ PVMC 736 also includes one or more MTJ circuits 738P(1)-738P(P) in a P state that are configured to be powered by the supply voltage Vdd from the supply voltage input 732M. The MTJ circuits 738P(1)-738P(P) are configured as a P MTJ ring oscillator 802(1) in this example wherein P is an odd number that is three or greater. Each MTJ circuit 738P(1)-738P(P) is configured to receive an MTJ input voltage Vpi(1)-Vpi(P) on an MTJ input node 750P(I)(1)-750P(I)(P) from an MTJ output node 750P(O)(2)-750P(O)(P) and 750P(O)(1) of a preceding MTJ circuit 738P(1)-738(P) (shown in further detail in FIG. 8). Each MTJ circuit 738P(1)-738(P) is configured to generate an MTJ output voltage Vpo(1)-Vpo(P) on a respective MTJ output node 750P(O)(1)-750P(O)(P) based on the received MTJ input voltage Vpi(1)-Vpi(P). The MTJ circuits 738P(1)-738P(P) are configured to be in a P magnetization state to measure MTJ process variation of the MRAM bit cells 406(0)(0)-406(M)(N) that are in a P magnetization state. As shown in FIG. 7, the MTJ circuits 738P(1)-738P(P) each include a measurement transistor 740P of a MOS type of an access transistor 414 included in at least one MRAM bit cell 406(0)(0)-406(M)(N) in the MRAM array 404. The MTJ circuits 738P(1)-738P(P) also each include a measurement MTJ device 742P of a type of an MTJ device 412 included in at least one MRAM bit cell 406(0)(0)-406(M)(N) in the MRAM array 404. Because the MTJ circuits 738P(1)-738P(P) are fabricated on the same die being part of a same IC 709 in this example, the measurement transistor 740P and the measurement MTJ device 742P will have the same or similar global process variations as in the access transistor 414 and MTJ device 412 of the MRAM bit cells 406(0)(0)-406(M)(N). Thus, the performance of the MTJ circuits 738P(1)-738P(P) can be measured to represent the MTJ process variations in the MRAM bit cells 406(0)(0)-406(M)(N) when in the P magnetization state, because the MTJ circuits 738P(1)-738P(P) should experience the same or similar performance delay as the MRAM bit cells 406(0)(0)-406(M)(N).

With continuing reference to FIGS. 7 and 8, the MTJ PVMC 736 also includes one or more MTJ circuits 738A(1)-738A(P) in an AP state that are configured to be powered by the supply voltage Vdd from the supply voltage input 732M. The MTJ circuits 738A(1)-738A(P) are configured to be in an AP magnetization state to measure MTJ process variations of the MRAM bit cells 406(0)(0)-406(M)(N) that are in an AP magnetization state. The MTJ circuits 738A(1)-738A(P) are configured as an AP MTJ ring oscillator 804 in this example, wherein P is an odd number that is three or greater. Each MTJ circuit 738A(1)-738A(P) is configured to receive an MTJ input voltage Vai(1)-Vai(P) on an MTJ input node 750A(I)(1)-750A(I)(P) from an MTJ output node 750A(O)(2)-750A(O)(P), 750A(O)(1) of a preceding MTJ circuit 738A(1)-738A(P). Each MTJ circuit 738A(1)-738A(P) is configured generate an MTJ output voltage Vao(1)-Vao(P) on a respective MTJ output node 750A(O)(1)-750A(O)(P) based on the received MTJ input voltage Vai(1)-Vai(P). As shown in FIG. 7, the MTJ circuits 738A(1)-738A(P) each include a measurement transistor 740A of a MOS type of an access transistor 414 included in at least one MRAM bit cell 406(0)(0)-406(M)(N) in the MRAM array 404. The MTJ circuits 738A(1)-738A(P) also each include a measurement MTJ device 742A of a type of an MTJ device 412 included in at least one MRAM bit cell 406(0)(0)-406(M)(N) in the MRAM array 404. Because the MTJ circuits 738A(1)-738A(P) are fabricated on the same die being part of the same IC 709 in this example, the measurement transistor 740A and the measurement MTJ device 742A will have the same or similar global process variations as in the access transistor 414 and MTJ device 412 of the MRAM bit cells 406(0)(0)-406(M)(N). Thus, the performance of the MTJ circuits 738A(1)-738A(P) can be measured to represent the MTJ process variations in the MRAM bit cells 406(0)(0)-406(M)(N) when in the P magnetization state, because the MTJ circuits 738A(1)-738A(P) should experience the same or similar performance delay as the MRAM bit cells 406(0)(0)-406(M)(N).

With continuing reference to FIGS. 7 and 8, the logic PVMC 704 includes one or more logic circuits 738L(1)-738L(P) configured to be powered by the supply voltage Vdd from a supply voltage input 732L. The logic circuits 738L(1)-738L(P) are configured to measure the logic process variations of the MRAM bit cells 406(0)(0)-406(M)(N). For example, the logic circuits 738L(1)-738L(P) may include transistors of a MOS type of an access transistor 414 included in at least one MRAM bit cell 406(0)(0)-406(M)(N) in the MRAM array 404. Because the logic circuits 738L(1)-738L(P) are fabricated on the same die being part of the same IC 709 in this example, the logic circuits 738L(1)-738L(P) will have the same or similar global process variations as in the access transistor 414 and MTJ device 412 of the MRAM bit cells 406(0)(0)-406(M)(N). Thus, the performance of the logic circuits 738L(1)-738L(P) can be measured to represent the logic process variations in the MRAM bit cells 406(0)(0)-406(M)(N), because the logic circuits 738L(1)-738L(P) should experience the same or similar performance delay as the access transistors 414 in the MRAM bit cells 406(0)(0)-406(M)(N).

The logic circuits 738L(1)-738L(P) in this example are configured as a logic ring oscillator 800 in this example wherein P is an odd number that is three or greater, and the logic circuits 738L(1)-738L(P) are each inverting logic circuits configured to generate an inverted output voltage state from an input voltage state. Each logic circuit 738L(1)-738L(P) is configured to receive a logic input voltage Vli(1)-Vli(P) on a logic input node 750L(I)(1)-750L(I)(P) from a logic output node 750L(O)(2)-750L(O)(P), 750L(O)(1) of a preceding logic circuit 738L(1)-738L(P). Each logic circuit 738L(1)-738L(P) is also configured to generate a logic output voltage Vlo(1)-Vlo(P) on the logic output node 750L(O)(1)-750L(O)(P) based on a respective logic input voltage Vli(1)-Vli(P). The logic PVMC 704 is configured to generate a logic process variation measurement voltage signal 746L based on the performance of the logic circuits 738(1)-738L(P) as affected by their process variations on the logic PVMC output 744L. The logic process variation measurement voltage signal 746L indicates the process variation in the logic circuits 738L(1)-738L(P) representing the logic process variation of the access transistor 414 in the MRAM bit cells 406(0)(0)-406(N)(N). In this example, since the logic PVMC 704 is provided as a ring oscillator as shown in FIG. 8, the logic process variation measurement voltage signal 746L is also a voltage signal that has a frequency, wherein the frequency is a function of the logic process variation.

With continuing reference to FIGS. 7 and 8, the ambient temperature input 741 is coupled to an MRAM bit cell PVMC output 747. In this manner, the power management circuit 434 is configured to receive the ambient temperature measurement voltage signal 746T from the MRAM bit cell PVMC 702. In some examples, additional ambient temperature sensors can be included in the MRAM bit cell PVMC 702, in the MRAM array 404, in the MRAM 416, and/or other regions of the IC 409, as non-limiting examples. In examples having more than one temperature sensor, each temperature sensor can generate one or more ambient temperature measurement voltage signals. Multiple ambient temperature measurement voltage signals can be received by the power management circuit 434 by coupling each of the more than one ambient temperature sensors to the power management circuit. Multiple ambient temperature measurement voltage signals can also be received by the ambient temperature input 741. In this regard, each temperature sensor can be coupled to a multiplexer or a bus to transmit the ambient temperature measurement voltage signals to the ambient temperature input 741. Ambient temperature sensors can include a silicon (Si) bandgap temperature sensor(s), a thermistor(s), a resistance thermometer(s), and a thermocouple(s), as non-limiting examples. In some examples, ambient temperature sensor(s) can be coupled to the supply voltage Vdd to generate an ambient temperature measurement voltage signal(s) as a function of the supply voltage Vdd.

Figure 9A:
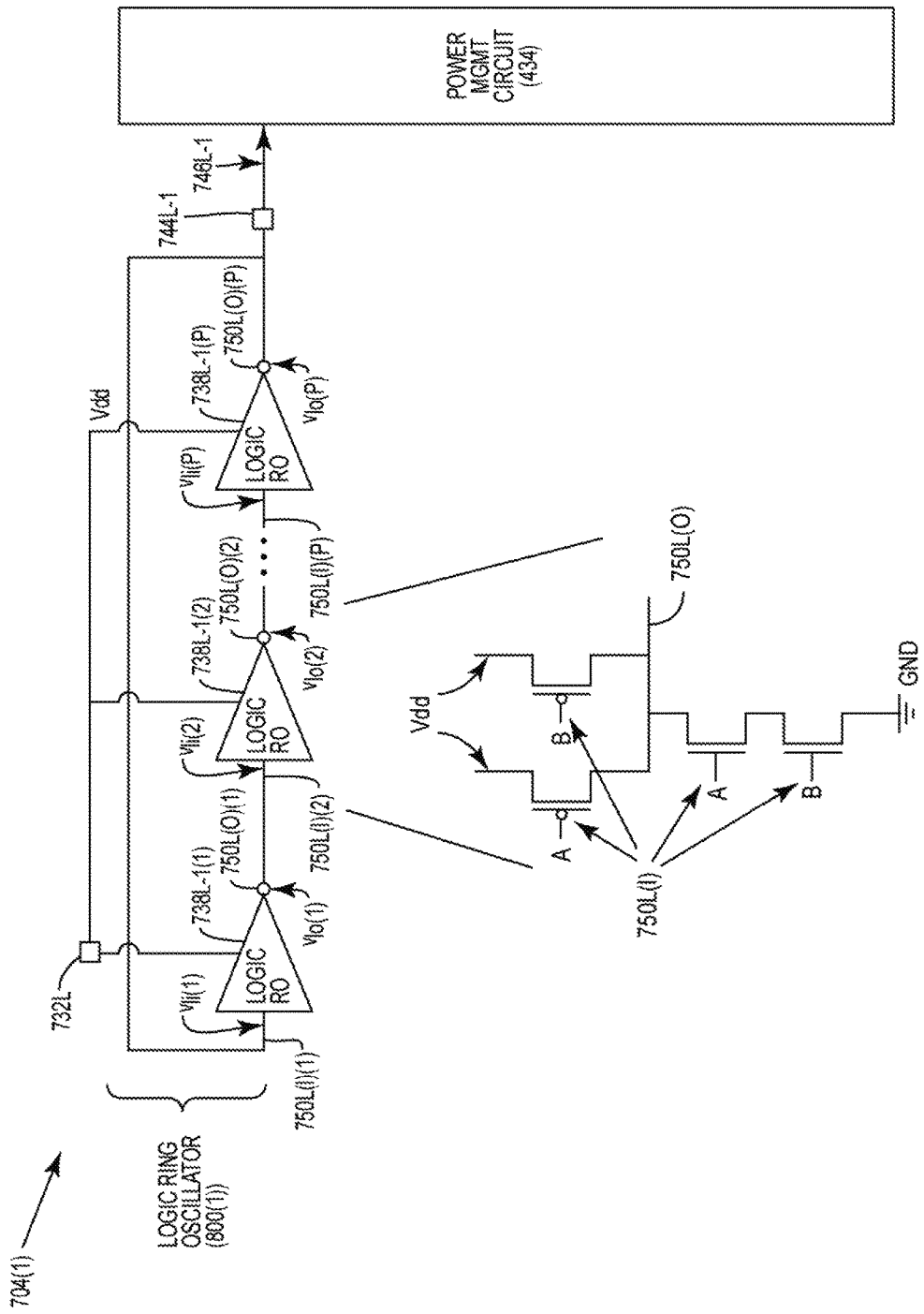
FIG. 9A is a schematic diagram of an exemplary logic ring oscillator circuit that can be employed as the logic ring oscillator circuit in the logic PVMC in FIG. 7 to measure process variations in logic circuits dominated by N-type metal oxide semiconductor (MOS) (NMOS) devices.
Figure 9B:
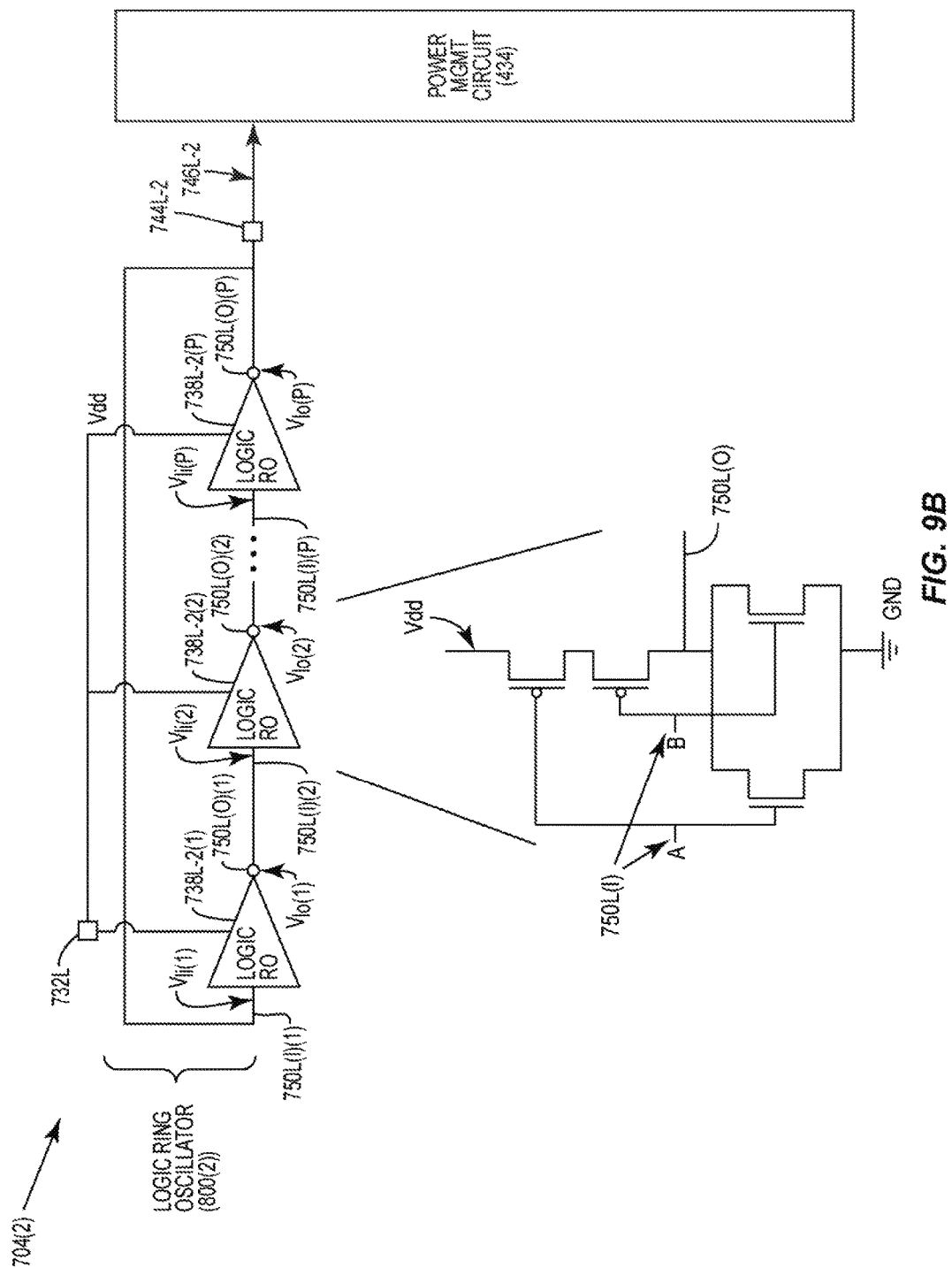
FIG. 9B is a schematic diagram of an exemplary logic ring oscillator circuit that can be employed as the logic ring oscillator circuit in the logic PVMC in FIG. 7 to measure process variations in logic circuits dominated by P-type MOS (PMOS) devices.

FIGS. 9A and 9B provide examples of PVMC circuits that can be employed as the logic PVMC 704 in FIG. 7. For example, as shown in FIG. 9A, if the process variation in the MRAM bit cells 406(0)(0)-406(M)(N) is dominated by NMOS transistors (e.g., the access transistors 414 are NMOS transistors), a logic PVMC 704(1) can be provided as a logic ring oscillator 800(1) that includes logic circuits 738L(1)-738L(P) are provided as NAND logic circuits 738L-1(1)-738L-1(P). The logic ring oscillator 800(1) is configured to generate a logic process variation measurement voltage signal 746L-1 based on the performance of the NAND logic circuits 738L-1(1)-738L-1(P) as affected by the process variations on a logic PVMC output 744L-1. As another example shown in FIG. 9B, if the process variation in the MRAM bit cells 406(0)(0)-406(M)(N) is dominated by PMOS transistors (e.g., the access transistors 414 are PMOS transistors), a logic PVMC 704(2) can be provided as a logic ring oscillator 800(2) that includes the logic circuits 738L(1)-738L(P) provided as NOR logic circuits 738L-2(1)-738L-2(P). The logic ring oscillator 800(2) is configured to generate a logic process variation measurement voltage signal 746L-2 based on the performance of the NOR logic circuits 738L-2(1)-738L-2(P) as affected by the process variations on a logic PVMC output 744L-2.

With continuing reference to FIGS. 7 and 8, the MTJ PVMC 736 includes MTJ PVMC outputs 744P, 744A coupled to the respective MTJ circuits 738P(1)-738P(P) and 738A(1)-738A(P). The MTJ PVMC 736 is configured to generate on the MTJ PVMC output 744P, a process variation measurement voltage signal 746P indicating the process variation in the measurement transistor 740P(1)-740P(P) and process variation in the measurement MTJ devices 742P(1)-742P(1) of the MTJ circuits 738P(1)-738P(P) are in a P magnetization state, representing the MTJ process variation of the MRAM bit cells 406(0)(0)-406(N)(N) are in an AP magnetization state. The MTJ PVMC 736 is also configured to generate on the MTJ PVMC output 744A, a process variation measurement voltage signal 746A indicating the process variation in the measurement transistor 740A(1)-740A(P) and process variation in the measurement MTJ devices 742A(1)-742A(1) of the MTJ circuits 738A(1)-738A(P) are in an AP magnetization state, representing the MTJ process variation of the MRAM bit cells 406(0)(0)-406(N)(N) are in an AP magnetization state. In this example, since the MTJ PVMC 736 is provided as ring oscillators as shown in FIG. 8, the process variation measurement voltage signals 746P, 746A are voltage signal that have a frequency, wherein the frequency is a function of process variation. The higher the frequency, the less delay in the respective MTJ circuits 738P(1)-738P(P), 738A(1)-738A(P) generating MTJ output voltages Vpo(1)-Vpo(P), Vao(1)-Vao(P) that alternate in voltage state between the supply voltage Vdd and ground to generate the process variation measurement voltage signals 746P, 746A as voltage frequency signals.

The power management circuit 434 is configured to receive the ambient temperature and variation measurement voltage signals 746T, 746L, 746A, 746P from the MRAM bit cell PVMC 702. The power management circuit 434 is configured to determine a supply voltage level for the supply voltage Vdd based on the received ambient temperature and variation measurement voltage signals 746T, 746L, 746A, 746P. The power management circuit 434 is then configured to dynamically generate the supply voltage Vdd at the determined supply voltage level based on the ambient temperature and process variations indicated by the received ambient temperature and variation measurement voltage signals 746T, 746L, 746A, 746P. As discussed above, the power management circuit 434 includes the memory 448 that can be configured to store parameters indicative of the logic and MTJ process variations determined for the MRAM bit cells 406(0)(0)-406(M)(N) based on the process variation measurement voltage signals 746L, 746A, 746P that can then be used to determine the supply voltage level to generate the supply voltage level Vdd. Further, the memory 448 in the power management circuit 434 can be configured to store parameters indicative of the ambient temperature determined for the MRAM bit cells 406(0)(0)-406(M)(N) based on the ambient temperature measurement voltage signal 746T that can then be used to determine the supply voltage level to generate the supply voltage level Vdd.

Also, as will be discussed in more detail below, the power management circuit 434 can be configured to separately determine the effect to the MTJ process variation from the logic process variation in the MTJ PVMC 736 by using the logic process variation measurement voltage signal 746L. The logic process variation measurement voltage signal 746L represents only the effect of the logic process variation in the logic circuits 738L(1)-738L(P), which can be used in conjunction with the process variation measurement voltage signals 746A, 746P to determine the effect of the MTJ process variation alone in the MTJ circuits 738P(1)-738P(P) and 738A(1)-738A(P), for P and AP magnetization states, respectively. This may allow for generating the supply voltage Vdd without a lower switching current margin while achieving the same or improved bit error yield results and without overstressing the MRAM bit cells 406(0)(0)-406(M)(N)

Figure 10A:
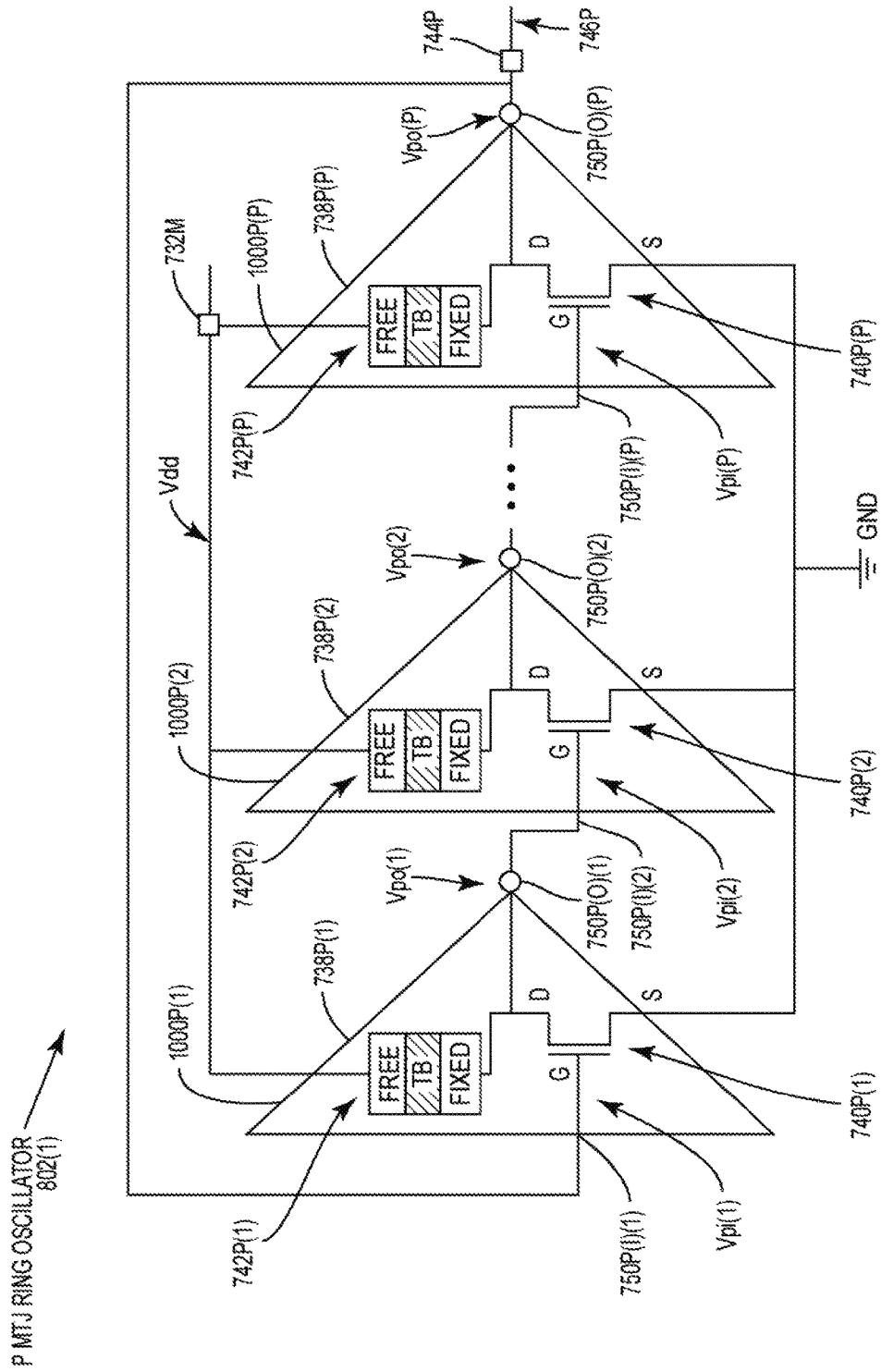
FIG. 10A is a schematic diagram of an exemplary MTJ ring oscillator circuit that can be included in the MTJ PVMC in FIG. 7 and which includes an odd plurality of series connected MRAM circuits each comprising a measurement transistor coupled to an MTJ device with a free layer of the MTJ device coupled to a supply voltage, and a pinned layer of the MTJ device coupled to a drain of the measurement transistor to generate a process variation measurement voltage signal indicating an MTJ process variation in an MRAM bit cell in a P magnetization state.
Figure 10B:
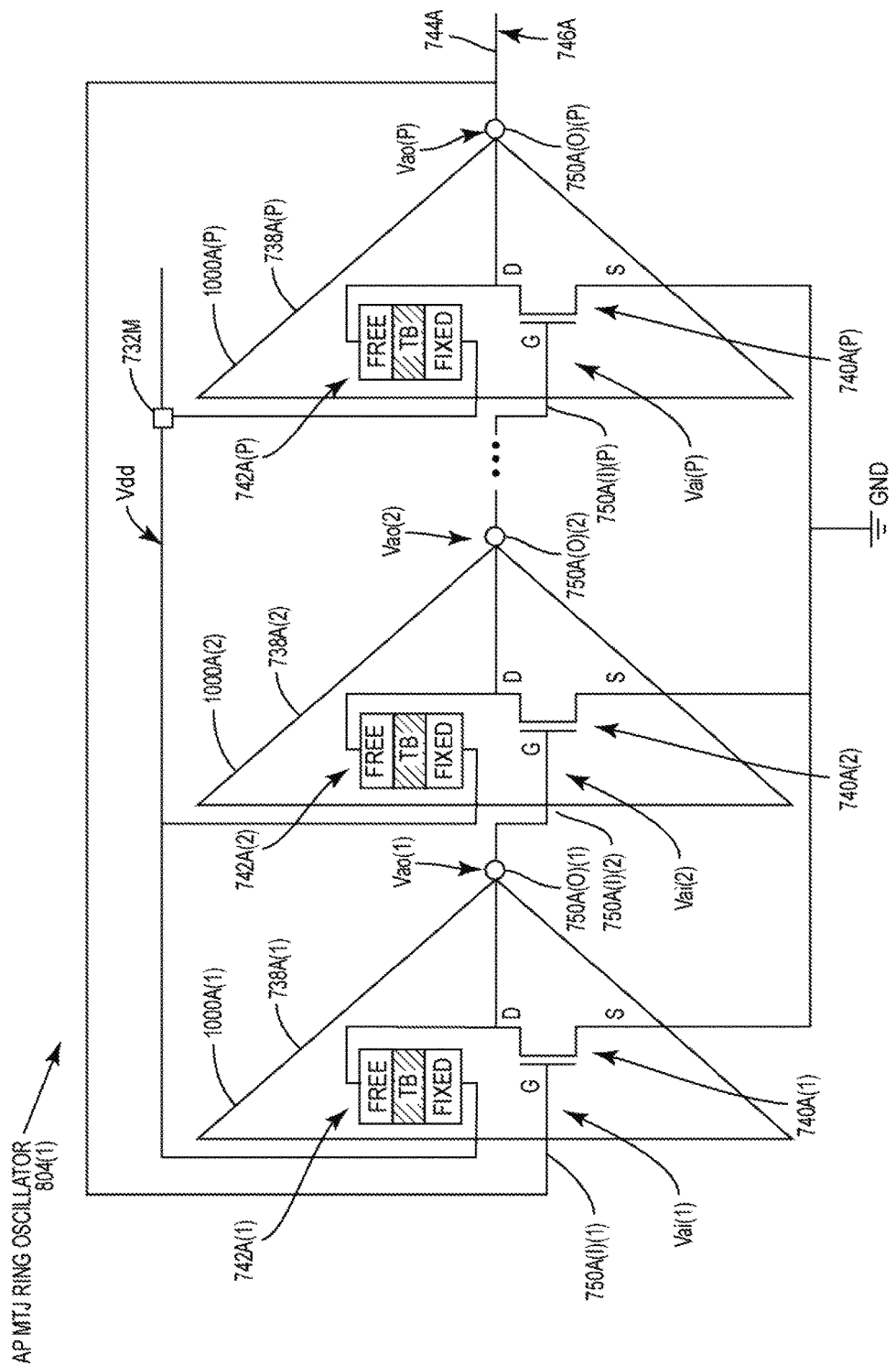
FIG. 10B is a schematic diagram of an exemplary MTJ ring oscillator circuit that can be included in the MTJ PVMC in FIG. 7 and which includes an odd plurality of series connected MRAM circuits each comprising a measurement transistor coupled to an MTJ device with a pinned layer of the MTJ device coupled to a supply voltage, and a free layer of the MTJ device coupled to a drain of the measurement transistor to generate a process variation measurement voltage signal indicating an MTJ process variation in an MRAM bit cell in an AP magnetization state.
Figure 10C:
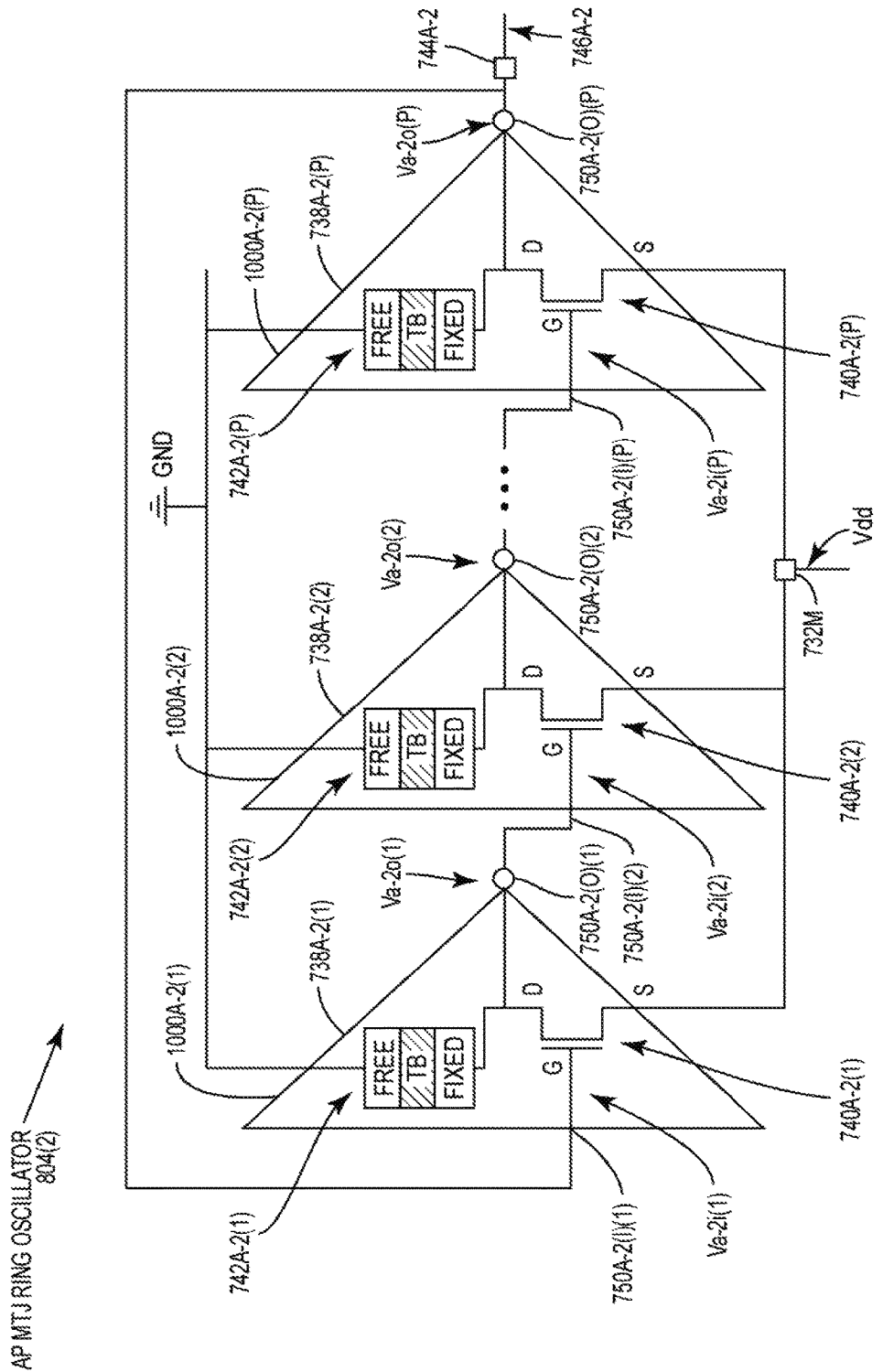
FIG. 10C is a schematic diagram of another exemplary MTJ ring oscillator circuit that can be included in the MTJ PVMC in FIG. 7 and which includes an odd plurality of series connected MRAM circuits each comprising a measurement transistor coupled to an MTJ device with a free layer of the MTJ device coupled to a ground node, and a pinned layer of the MTJ device coupled to a drain of the measurement transistor to generate a process variation measurement voltage signal indicating an MTJ process variation in an MRAM bit cell in an AP magnetization state.

FIGS. 10A-10C illustrate examples of MTJ ring oscillators 802(1), 804(1)-804(2) that can be provided as the MTJ ring oscillators 802, 804 in the MTJ PVMC 736 in FIG. 8. In this regard, FIG. 10A is a schematic diagram of an exemplary P MTJ ring oscillator 802(1) that can be employed as the P MTJ ring oscillator 802(1) in the MTJ PVMC 736 in FIG. 8. As discussed below, the P MTJ ring oscillator 802(1) is configured to generate the process variation measurement voltage signal 746P as a function of process variation in the MRAM bit cells 406(0)(0)-406(M)(N) that are in the P magnetization state. Process variations in the MRAM bit cells 406(0)(0)-406(M)(N) that are in a P magnetization state may exhibit different performance characteristics than when the MRAM bit cells 406(0)(0)-406(M)(N) are in an AP magnetization state. As discussed above, the power management circuit 434 in FIG. 7 is configured to receive both the process variation measurement voltage signals 746P, 746A to provide information about process variations for both the P and AP magnetization states to dynamically adjust the supply voltage Vdd for write operations based on the magnetization state to be written to the MRAM bit cells 406(0)(0)-406(M)(N) in a write operation.

With reference to FIG. 10A, the P MTJ ring oscillator 802(1) includes an odd number of at least three of the MTJ circuits 738P(1)-738P(P) each comprising a respective inverting logic circuit 1000P(1)-1000P(P) connected in series with each other. An odd number of the inverting logic circuits 1000P(1)-1000P(P) are each configured to perform a logic inversion operation so that the process variation measurement voltage signal 746P will alternate between different voltage states as a function of delay of voltage signal propagation through the P MTJ ring oscillator 802(1). Each inverting logic circuit 1000P(1)-1000P(P) has a respective MTJ input node 750P(I)(1)-750P(I)(P) and an MTJ output node 750P(O)(1)-750(O)(P). Each inverting logic circuit 1000P(1)-1000P(P) includes a measurement transistor 740P(1)-740P(P) comprising a gate G, a source S, and a drain D. The sources S of each measurement transistor 740P(1)-740P(P) are coupled to a ground node GND. The measurement transistors 740P(1)-740P(P) may be selected to be a MOS type of the access transistors 414 provided in the MRAM bit cells 406(0)(0)-406(M)(N) in the memory system 700 in FIG. 7 so that the performance (i.e., drive strength) of the measurement transistors 740P(1)-740P(P) represents the performance and thus the process variation in the access transistors 414.

With continuing reference to FIG. 10A, each inverting logic circuit 1000P(1)-1000P(P) also includes a measurement MTJ device 742P(1)-742P(P) that includes a pinned layer FIXED, a free layer FREE, and a tunnel barrier TB disposed between the pinned layer FIXED and the free layer FREE. The measurement MTJ devices 742P(1)-742P(P) may be fabricated according to the same specifications as the MTJ devices 412 in the MRAM bit cells 406(0)(0)-406(M)(N) in the memory system 700 in FIG. 7 so that the resistance of the measurement MTJ device 742P(1)-742P(P) represents the resistance and thus the process variation in the MTJ devices 412. The free layers FREE of the measurement MTJ devices 742P(1)-742P(P) are coupled to the supply voltage input 732M (see also FIG. 7) to keep the measurement MTJ devices 742P(1)-742P(P) in a P magnetization state. The drains D of the measurement transistors 740P(1)-740P(P) are each coupled to the pinned layers FIXED of the respective measurement MTJ devices 742P(1)-742P(P) and the gates G of the measurement transistors 740P(1)-740P(P) in a succeeding inverting logic circuit 1000P(1)-1000P(P). The MTJ PVMC output 744P is coupled to the gate G of the measurement transistor 740P(1) in the first inverting logic circuit 1000P(1).

The supply voltage Vdd being applied to the supply voltage input 732M causes a switching current to pass through the measurement MTJ devices 742P(1)-742P(P) and to the drain D of the measurement transistors 740P(1)-740P(P) to provide respective MTJ output voltages Vpo(1)-Vpo(P) on MTJ output nodes 750P(O)(1)-750P(O)(P). The MTJ output voltages Vpo(1)-Vpo(P) are provided as MTJ inputs voltages Vpi(2)-Vpi(P), Vpi(1) to MTJ input nodes 750P(I)(1)-750P(I)(P) of respective succeeding MTJ devices 742P(2)-742P(P), 742P(1). Thus, every odd measurement transistor 740P(1)-740(P) will be turned on by the MTJ output voltage Vpo(1)-Vpo(P) at their respective gate G with the other measurement transistors 740P(1)-740(P) turned off by the MTJ output voltage Vpo(1)-Vpo(P) at their respective gate G at a given time, switching back and forth between on and off states. Thus, the last MTJ voltage output Vpo(P) that provides the process variation measurement voltage signal 746P will alternate states as a function of the performance affected by process variation of the inverting logic circuits 1000P(1)-1000P(P).

FIG. 10B is a schematic diagram of an exemplary AP MTJ ring oscillator 804(1) that can be employed as the AP MTJ ring oscillator 804 in the MTJ PVMC 736 in FIG. 8. As discussed below, the AP MTJ ring oscillator 804(1) is configured to generate the process variation measurement voltage signal 746A as a function of process variation in the MRAM bit cells 406(0)(0)-406(M)(N) that are in the AP magnetization state. Process variations in the MRAM bit cells 406(0)(0)-406(M)(N) are in an AP magnetization state may exhibit different performance characteristics than when the MRAM bit cells 406(0)(0)-406(M)(N) are in a P magnetization state. As discussed above, the power management circuit 434 in FIG. 7 is configured to receive both process variation measurement voltage signals 746P, 746A to provide information about process variations for both the P and AP magnetization states to dynamically adjust the supply voltage Vdd for write operations based on the magnetization state to be written to the MRAM bit cells 406(0)(0)-406(M)(N) in a write operation.

With reference to FIG. 10B, the AP MTJ ring oscillator 804(1) includes an odd number of at least three (3) of the MTJ circuits 738A(1)-738A(P) each comprising a respective inverting logic circuits 1000A(1)-1000A(P) connected in series with each other. An odd number of the inverting logic circuits 1000A(1)-1000A(P) are each configured to perform a logic inversion operation so that the process variation measurement voltage signal 746A will alternate between different voltage states as a function of delay of voltage signal propagation through the AP MTJ ring oscillator 804(1). Each inverting logic circuit 1000A(1)-1000A(P) has a respective MTJ input node 750A(I)(1)-750A(I)(P)

and an MTJ output node 750A(O)(1)-750A(O)(P). Each inverting logic circuit 1000A(1)-1000A(P) includes a measurement transistor 740A(1)-740A(P) comprising a gate G, a source S, and a drain D. The sources S of each measurement transistor 740A(1)-740A(P) are coupled to a ground node GND. The measurement transistors 740A(1)-740A(P) may be selected to be a MOS type of the access transistors 414 provided in the MRAM bit cells 406(0)(0)-406(M)(N) in the memory system 700 in FIG. 7 so that the performance (i.e., drive strength) of the measurement transistors 740A(1)-740A(P) represents the performance, and thus the process variation, in the access transistors 414.

With continuing reference to FIG. 10B, each inverting logic circuit 1000A(1)-1000A(P) also includes a measurement MTJ device 742A(1)-742A(P) that includes a pinned layer FIXED, a free layer FREE, and a tunnel barrier TB disposed between the pinned layer FIXED and the free layer FREE. The measurement MTJ devices 742A(1)-742A(P) may be fabricated according to the same specifications as the MTJ devices 412 in the MRAM bit cells 406(0)(0)-406(M)(N) in the memory system 700 in FIG. 7 so that the resistance of the measurement MTJ devices 742A(1)-742A(P) represents the resistance, and thus the process variation, in the MTJ devices 412. The pinned layer FIXED of the measurement MTJ devices 742A(1)-742A(P) are coupled to the supply voltage input 732M (see also FIG. 7) to keep the measurement MTJ devices 742A(1)-742A(P) in an AP magnetization state. The drains D of the measurement transistors 740A(1)-740A(P) are each coupled to the free layer FREE of the respective measurement MTJ devices 742A(1)-742A(P) and the gates G of the measurement transistors 740A(1)-740A(P) in a succeeding inverting logic circuit 1000A(1)-1000A(P). The MTJ PVMC output 744A is coupled to the gate G of the measurement transistor 740A(1) in the first inverting logic circuit 1000A(1).

The supply voltage Vdd being applied to the supply voltage input 732M causes a switching current to pass through the measurement MTJ devices 742A(1)-742A(P) and to the drains D of the measurement transistors 740A(1)-740A(P) to provide respective MTJ output voltages Vao(1)-Vao(P) on MTJ output nodes 750A(O)(1)-750A(O)(P). The MTJ output voltages Vao(1)-Vao(P) are provided as MTJ inputs voltages Vai(2)-Vai(P), Vpi(1) to MTJ input nodes 750A(I)(1)-750A(I)(P) of respective succeeding MTJ devices 742A(2)-742A(P), 742A(1). Thus, every odd measurement transistor 740A(1)-740A(P) will be turned on by the MTJ output voltage Vao(1)-Vao(P) at their respective gate G with the other measurement transistors 740A(1)-740A(P) turned off by the MTJ output voltage Vpa(1)-Vpa(P) at their respective gate G at a given time, switching back and forth between on and off states. Thus, the last MTJ voltage output Vpa(P) that provides the process variation measurement voltage signal 746A will alternate states as a function of the performance affected by process variation of the inverting logic circuits 1000A(1)-1000A(P).

FIG. 10C is a schematic diagram of another exemplary AP MTJ ring oscillator 804(2) that can be employed as the AP MTJ ring oscillator 804 in the MTJ PVMC 736 in FIG. 8. As discussed below, the AP MTJ ring oscillator 804(2) includes the same circuit scheme as provided in the P MTJ ring oscillator 802(1) in FIG. 10A, but the supply voltage Vdd and ground node GND connections are reversed. This circuit scheme provides for the source degeneration body effect of the measurement transistors 740A-2(1)-740A-2(P) in the AP MTJ ring oscillator 804(2) to be present, which increases the threshold voltage of the measurement transistors 740A-2(1)-740A-2(P) and the performance of the measurement transistors 740A-2(1)-740A-2(P). This circuit connection scheme may provide a closer representation of the MRAM bit cells 406(0)(0)-406(M)(N). Thus, the AP MTJ ring oscillator 804(2) is still configured to generate a process variation measurement voltage signal 746A-2 as a function of process variation in the MRAM bit cells 406(0)(0)-406(M)(N) that are in the AP magnetization state.

With reference to FIG. 10C, the AP MTJ ring oscillator 804(2) includes an odd number of at least three (3) of the MTJ circuits 738A-2(1)-738A-2(P) each comprising a respective inverting logic circuit 1000A-2(1)-1000A-2(P) connected in series with each other. An odd number of the inverting logic circuits 1000A-2(1)-1000A-2(P) are each configured to perform a logic inversion operation so that the process variation measurement voltage signal 746A-2 will alternate between different voltage states as a function of delay of voltage signal propagation through the AP MTJ ring oscillator 804(2). Each inverting logic circuit 1000A-2(1)-1000A-2(P) has a respective MTJ input node 750A-2(I)(1)-750A-2(I)(P) and an MTJ output node 750A-2(0)(1)-750A-2(0)(P). Each inverting logic circuit 1000A-2(1)-1000A-2(P) includes a measurement transistor 740A-2(1)-740A-2(P) comprising a gate G, a source S, and a drain D. The sources S of each measurement transistor 740A(1)-740A(P) are coupled to the supply voltage input 732M. The measurement transistors 740A-2(1)-740A-2(P) may be selected to be a MOS type of the access transistors 414 provided in the MRAM bit cells 406(0)(0)-406(M)(N) in the memory system 700 in FIG. 7 so that the performance (i.e., drive strength) of the measurement transistors 740A(1)-740A(P) represents the performance, and thus the process variation, in the access transistors 414.

With continuing reference to FIG. 10C, each inverting logic circuit 1000A-2(1)-1000A-2(P) also includes a measurement MTJ device 742A-2(1)-742A-2(P) that includes a pinned layer FIXED, a free layer FREE, and a tunnel barrier TB disposed between the pinned layer FIXED and the free layer FREE. The measurement MTJ device 742A-2(1)-742A-2(P) may be fabricated according to the same specifications as the MTJ devices 412 in the MRAM bit cells 406(0)(0)-406(M)(N) in the memory system 700 in FIG. 7, so that the resistance of the measurement MTJ devices 742A-2(1)-742A-2(P) represents the resistance and thus the process variation in the MTJ devices 412. The free layer FREE of the measurement MTJ devices 742A-2(1)-742A-2(P) are coupled to the ground node GND (see also FIG. 7) to keep the measurement MTJ devices 742A-2(1)-742A-2(P) in an AP magnetization state. The drain D of the measurement transistors 740A(1)-740A(P) are each coupled to the pinned layer FIXED of the respective measurement MTJ device 742A-2(1)-742A-2(P) and the gate G of the measurement transistors 740A-2(1)-740A-2(P) in a succeeding inverting logic circuit 1000A-2(1)-1000A-2(P). The MTJ PVMC output 744A-2 is coupled to the gate G of the measurement transistor 740A-2(1) in the first inverting logic circuit 1000A-2(1).

The supply voltage Vdd being applied to the supply voltage input 732M causes a switching current to pass through the measurement MTJ devices 742A-2(1)-742A-2(P) and to the drain D of the measurement transistors 740A-2(1)-740A-2(P) to provide respective MTJ output voltages Va-2o(1)-Va-2o(P) on MTJ output nodes 750A-2(0)(1)-750A-2(0)(P). The MTJ output voltages Vao(1)-Va-2o(P) are provided as MTJ inputs voltages Va-2i(2)-Va-2i(P), Vpi(1) to MTJ input nodes 750A-2(I)(1)-750A-2(I)(P) of respective succeeding MTJ devices 742A-2(2)-742A-2(P), 742A-2(1). Thus, every odd measurement transistor 740A-2(1)-740A-2(P) will be turned on by the MTJ output voltage Va-2o(1)-Va-2o(P) at their respective gate G with the other measurement transistors 740A-2(1)-740A-2(P) turned off by the MTJ output voltage Va-2o(1)-Va-2o(P) at their respective gate G at a given time, switching back and forth between on and off states. Thus, the last MTJ voltage output Va-2o(P) that provides the process variation measurement voltage signal 746A-2 will alternate states as a function of the performance affected by process variation of the inverting logic circuits 1000A-2(1)-1000A-2(P).

Figure 11:
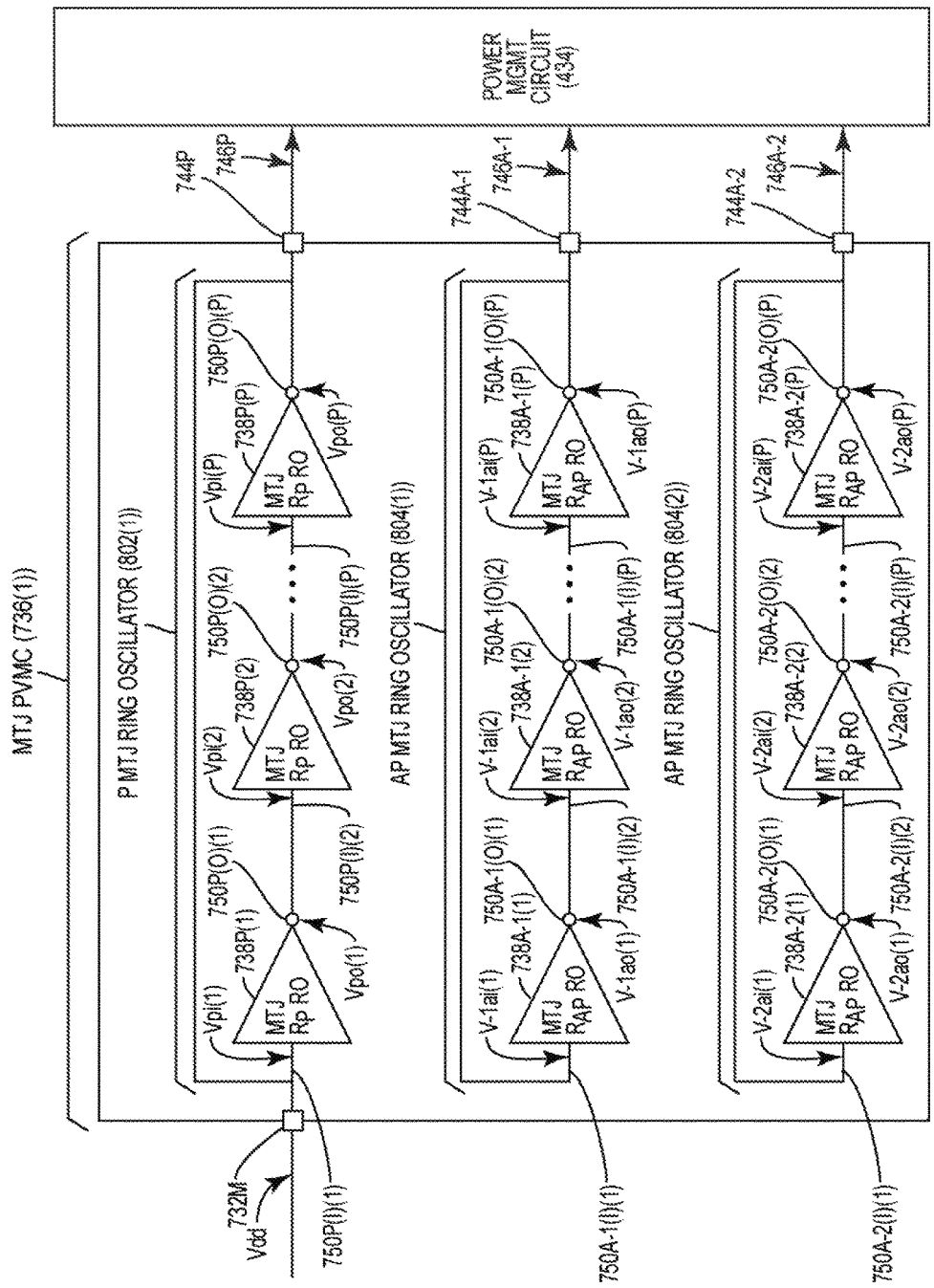
FIG. 11 is a schematic diagram of alternative exemplary MTJ ring oscillators that can be employed as MTJ ring oscillator circuits in the MTJ PVMC in FIG. 7 to measure MTJ process variations for P and AP magnetization states.

It may be desired to include both of the AP MTJ ring oscillators 804(1), 804(2) in FIGS. 10B and 10C in the MTJ PVMC 736 in the MRAM bit cell PVMC 702 in FIG. 7 for example, so that the performance of the AP MTJ ring oscillators 804(1), 804(2) can be combined or averaged to be used to determine process variation in the MRAM bit cells 406(0)(0)-406(M)(N). In this regard, FIG. 11 is a schematic diagram of the MTJ ring oscillators 802(1), 804(1), 804(2) in FIGS. 10A-10C that can be provided in an MTJ PVMC 736(1) that can be provided as the MTJ PVMC 736 in FIG. 7, for example, to measure MTJ process variations in the MRAM bit cells 406(0)(0)-406(M)(N) for P and AP magnetization states. In this regard, the delay performance of the MTJ ring oscillators 802(1), 804(1), 804(2) as indicated by the process variation measurement voltage signals 746P, 746A-1, 746A-2 along with the delay performance as indicated by the logic process variation measurement voltage signal 746L can be used by the power management circuit 434 to determine the process variation in the MRAM bit cells 406(0)(0)-406(M)(N) to dynamically adjust the supply voltage Vdd for write operations. For example, the power management circuit 434 may be equipped with equations, whose coefficients can be solved and stored in the memory 448 in the power management circuit 434 as shown in FIGS. 4 and 7, to be used to calculate the supply voltage Vdd to be generated for write operations.

In this regard, the delay performance $\tau_{wl\_n}$ of the logic ring oscillator 800 in FIG. 8 is proportional to the parasitic capacitance C of the logic circuits 738L(1)-738(L)(P), the supply voltage $V_{dd}$ provided to the logic circuits 738L(1)-738(L)(P), and the drive current $I_n$ of the logic circuits 738L(1)-738(L)(P), as shown below in Equation 1:

$$\text{Logic RO: } \tau_{wl\_n} \propto \frac{CV_{dd}}{I_n} \quad \text{Eq. (1)}$$

The delay performance $\tau_{mtj\_p}$ of the P MTJ ring oscillator 802(1) in FIG. 10A is proportional to the parasitic capacitance C of the measurement transistor 740P, the supply voltage $V_{dd}$ provided to the MTJ circuits 738P(1)-738P(P), and the effective drive current $I_{eff}$ of the MTJ circuits 738P(1)-738P(P), plus the delay performance $\tau_p$ as a result of the measurement MTJ device 742P resistance as shown below in Equation 2:

$$\text{MTJ Rp RO P: } \tau_{mtj\_p} \propto \frac{CV_{dd}}{I_{eff}} + \tau_p \approx \tau_{wl\_n} + \tau_p \quad \text{Eq. (2)}$$

Thus, the delay performance $\tau_p$ solely as a result of the measurement MTJ device 742P resistance in the P magnetization state can be extracted by subtracting the determined delay performance $\tau_{wl\_n}$ of the logic ring oscillator 800 from the delay performance $\tau_{mtj\_p}$ of the P MTJ ring oscillator 802(1), as shown below in Equation 3:

$$\text{Extract Rp Variation: } \tau_p = \tau_{mtj\_p} - \tau_{wl\_n} \quad \text{Eq. (3)}$$

Similarly, the delay performance $\tau_{mtj\_ap}$ of the AP MTJ ring oscillator 804(1) in FIG. 10B is proportional to the parasitic capacitance C of the measurement transistor 740A, the supply voltage $V_{dd}$ provided to the MTJ circuits 738A(1)-738A(P), and the effective drive current $I_{eff}$ of the MTJ circuits 738A(1)-738A(P), plus the delay performance $\tau_{ap}$ as a result of the measurement MTJ device 742A resistance as shown below in Equation 4:

$$\text{MTJ Rap RO A: } \tau_{mtj\_ap} \propto \frac{CV_{dd}}{I_{eff}} + \tau_{ap} \approx \tau_{wl\_n} + \tau_{ap} \quad \text{Eq. (4)}$$

Thus, the delay performance $\tau_{ap}$ solely as a result of the measurement MTJ device 742A resistance in the AP magnetization state can be extracted by subtracting the determined delay performance $\tau_{wl\_n}$ of the logic ring oscillator 800 from the delay performance $\tau_{mtj\_ap}$ of the AP MTJ ring oscillator 804(1), as shown below in Equation 5:

$$\text{Extract Rap Variation: } \tau_{ap} = \tau_{mtj\_ap} - \tau_{wl\_n} \quad \text{Eq. (5)}$$

Similarly, the delay performance $\tau_{mtj\_ap}$ of the AP MTJ ring oscillator 804(2) in FIG. 10C is proportional to the parasitic capacitance C of the measurement transistor 740A-2, the supply voltage $V_{dd}$ provided to the MTJ circuits 738A-2(1)-738A-2(P), and the effective drive current $I_{eff}$ of the MTJ circuits 738A-2(1)-738A-2(P), plus the delay performance $\tau_{ap}$ as a result of the measurement MTJ device 742A resistance as shown below in Equation 6:

$$\text{MTJ Rap RO A-2: } \tau_{mtj\_ap\_b} \propto \frac{CV_{dd}}{I_{eff}} + \tau_p \approx \tau_{wl\_b} + \tau_{ap} \quad \text{Eq. (6)}$$

Thus, the delay performance $\tau_{ap}$ taking into consideration the body effect of the MTJ circuits 738A-2(1)-738A-2(P) solely as a result of the measurement MTJ device 742A resistance in the AP magnetization state can be extracted as shown below in Equation 7:

$$\text{Extract WL w/body effect Variation: } \tau_{wl\_b} = \tau_{mtj\_ap\_b} - \tau_{ap} \quad \text{Eq. (7)}$$

With regard to incorporating ambient temperature in calculating the supply voltage Vdd, the ambient temperature input 741 can receive the ambient temperature measurement voltage signal 746T representing ambient temperature at the MRAM bit cells 406(0)(0)-406(M)(N) as generated by the ambient temperature sensor 745. The ambient temperature input 741, which is coupled to the power management circuit 434, can transmit the ambient temperature measurement voltage signal 746T representing ambient temperature at the MRAM bit cells 406(0)(0)-406(M)(N) to the power management circuit 434. In one example, the power management circuit 434 can use logic circuits to compare the ambient temperature measurement voltage signal 746T to values representing varying temperatures stored in the memory 448 of the power management circuit 434. A coefficient e(T) for determining a voltage $V_{c\_p}$ for switching the magnetization state of an MTJ device 412 in the MRAM bit cells 406(0)(0)-406(M)(N) from AP to P can be determined based on an output of the comparison logic circuits. Similarly, a coefficient f(T) for determining a voltage $V_{c\_ap}$ for switching the magnetization state of an MTJ device 412 in the MRAM bit cells 406(0)(0)-406(M)(N) from P to AP can be determined based on an output of the comparison logic circuits. In this manner, the coefficients e(T) and f(T) representing ambient temperature at the MRAM bit cells 406(0)(0)-406(M)(N) can be determined for use in determining the dynamic supply voltage Vdd ($V_{dyn\_p}$, $V_{dyn\_ap}$) for both P and AP magnetization state write operations.

Thus, with the process corners, the measurement MTJ devices 742 and/or the measurement transistors 740 in the MTJ circuits 738, and the ambient temperature inputs 741, the coefficients a(T), b(T), c(T), d(T), e(T), f(T) shown below can be determined by the power management circuit 434 and stored in memory 448 for different write operation scenarios to determine the dynamic supply voltage Vdd ($V_{dyn\_p}$) $V_{dyn\_ap}$) for both P and AP magnetization state write operations, determined as shown below in Equations 8 and 9. The dynamic supply voltage Vdd determined and generated by the power management circuit 434 can compensate for both individual logic and MTJ process variations against a typical process corner in the MRAM bit cells 406(0)(0)-406(M)(N), as well as ambient temperature at the MRAM bit cells 406(0)(0)-406(M)(N).

$$V_{dyn\_p} = a(T)^* \tau_{wl\_n} + b(T)^* \tau_p + e(T)^* V_{c\_p} \qquad \text{Eq. 8}$$

$$V_{dyn\_ap} = c(T)^* \tau_{wl\_b} + d(T)^* \tau_{ap} + f(T)^* V_{c\_ap} \qquad \text{Eq. 9}$$

Figure 12:
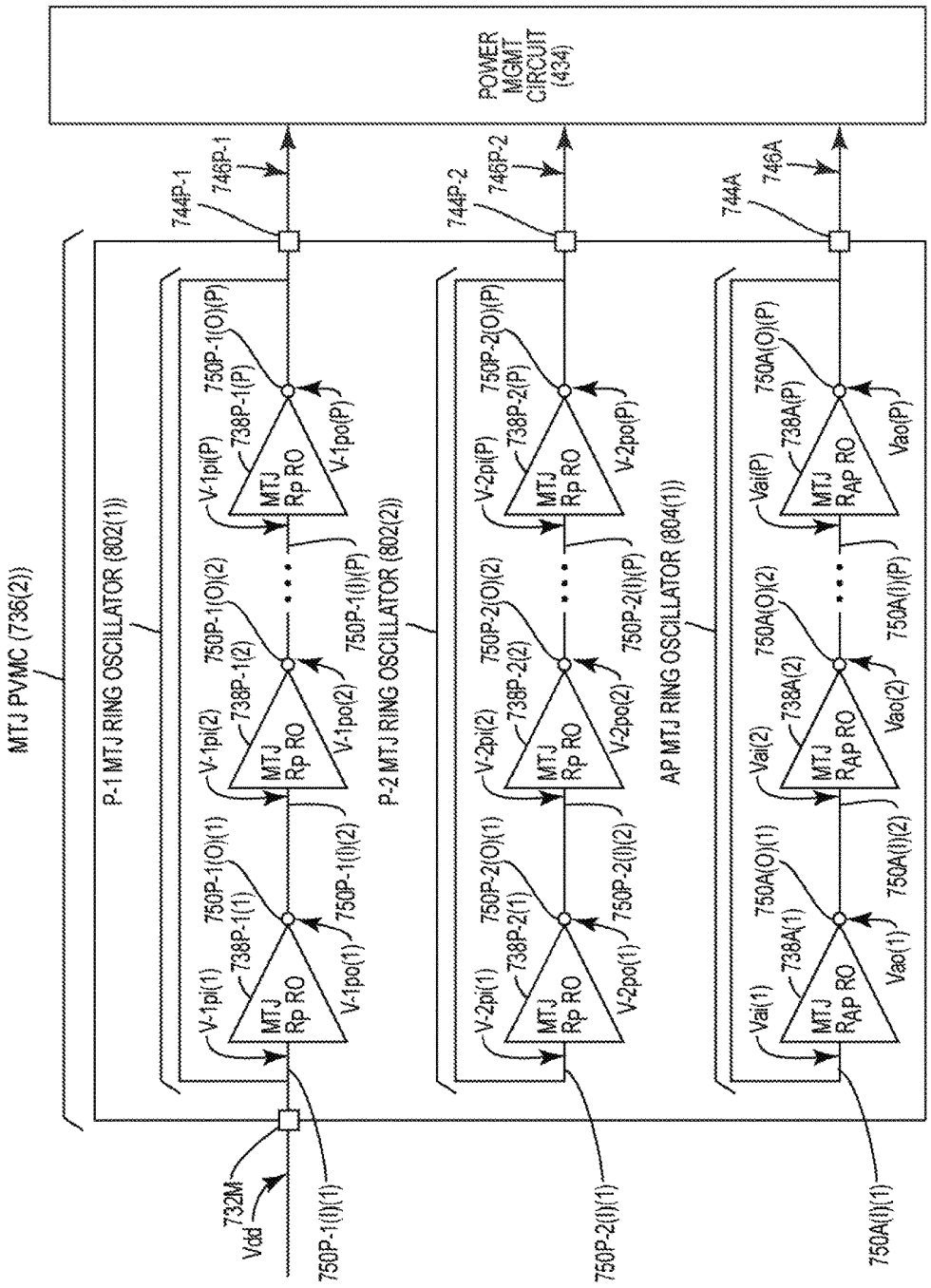
FIG. 12 is a schematic diagram of alternative exemplary MTJ ring oscillators that can be employed as MTJ ring oscillator circuits in the MRAM bit cell PVMC in FIG. 7 to measure MTJ process variations for P and AP magnetization states.
Figure 13A:
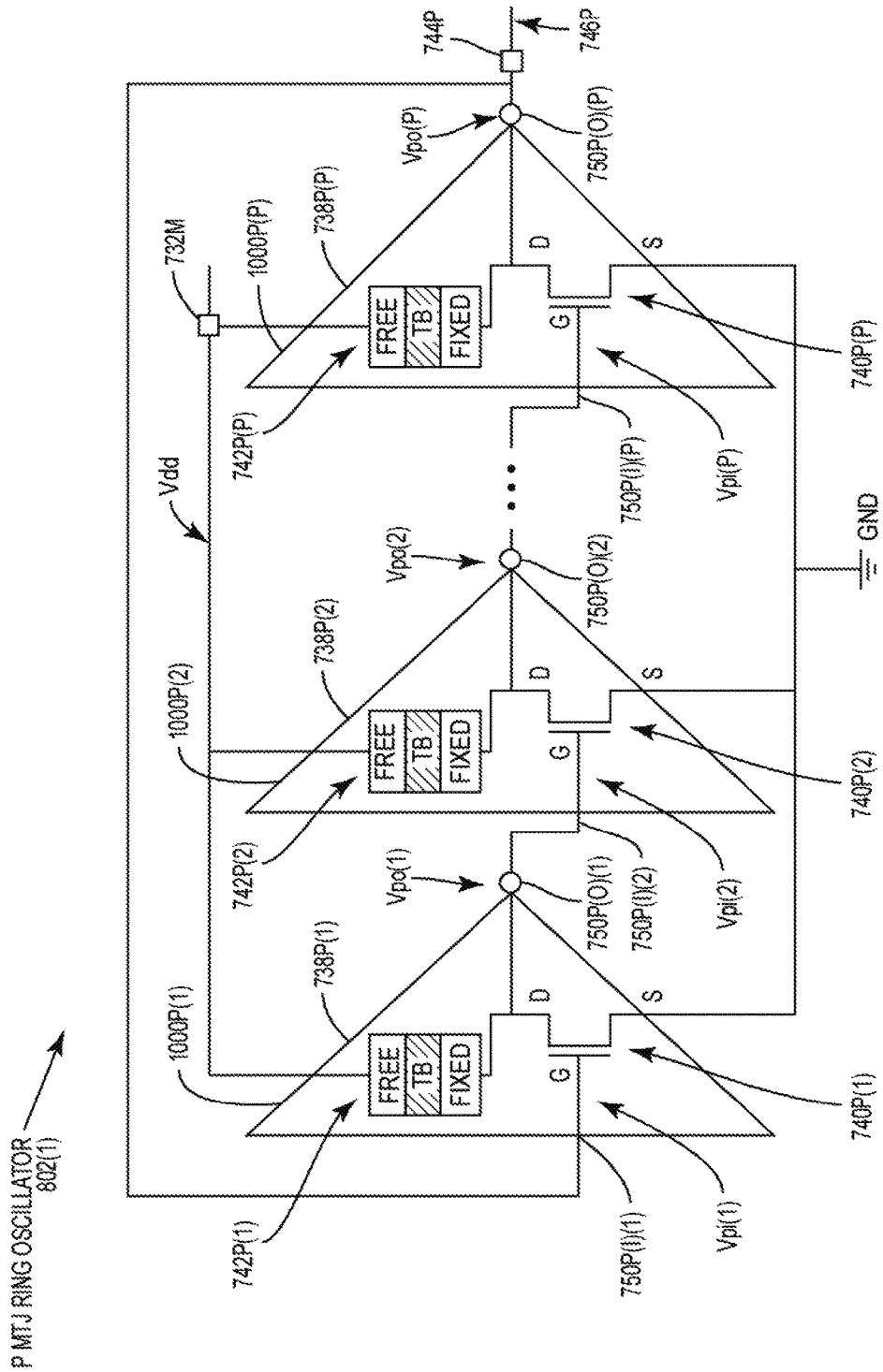
FIG. 13A is a schematic diagram of the exemplary MTJ ring oscillator circuit in FIG. 12.
Figure 13B:
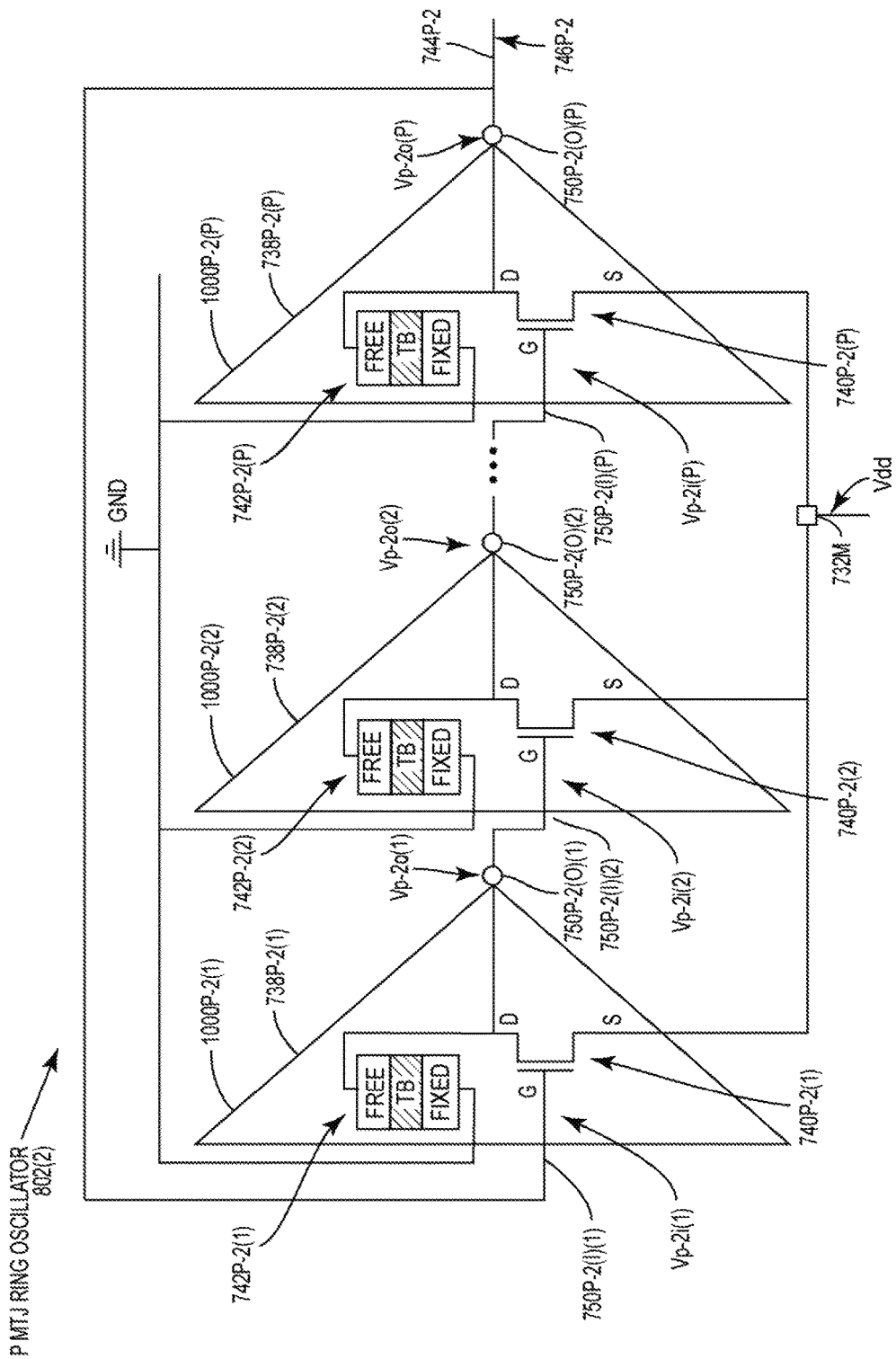
FIG. 13B is a schematic diagram of another exemplary MTJ ring oscillator circuit that includes an odd plurality of series connected MRAM circuits each comprising a measurement transistor coupled to an MTJ device with a pinned layer of the MTJ device coupled to a ground node, and a free layer of the MTJ device coupled to a drain of the measurement transistor to generate a process variation measurement voltage signal indicating an MTJ process variation in an MRAM bit cell in a P magnetization state.
Figure 13C:
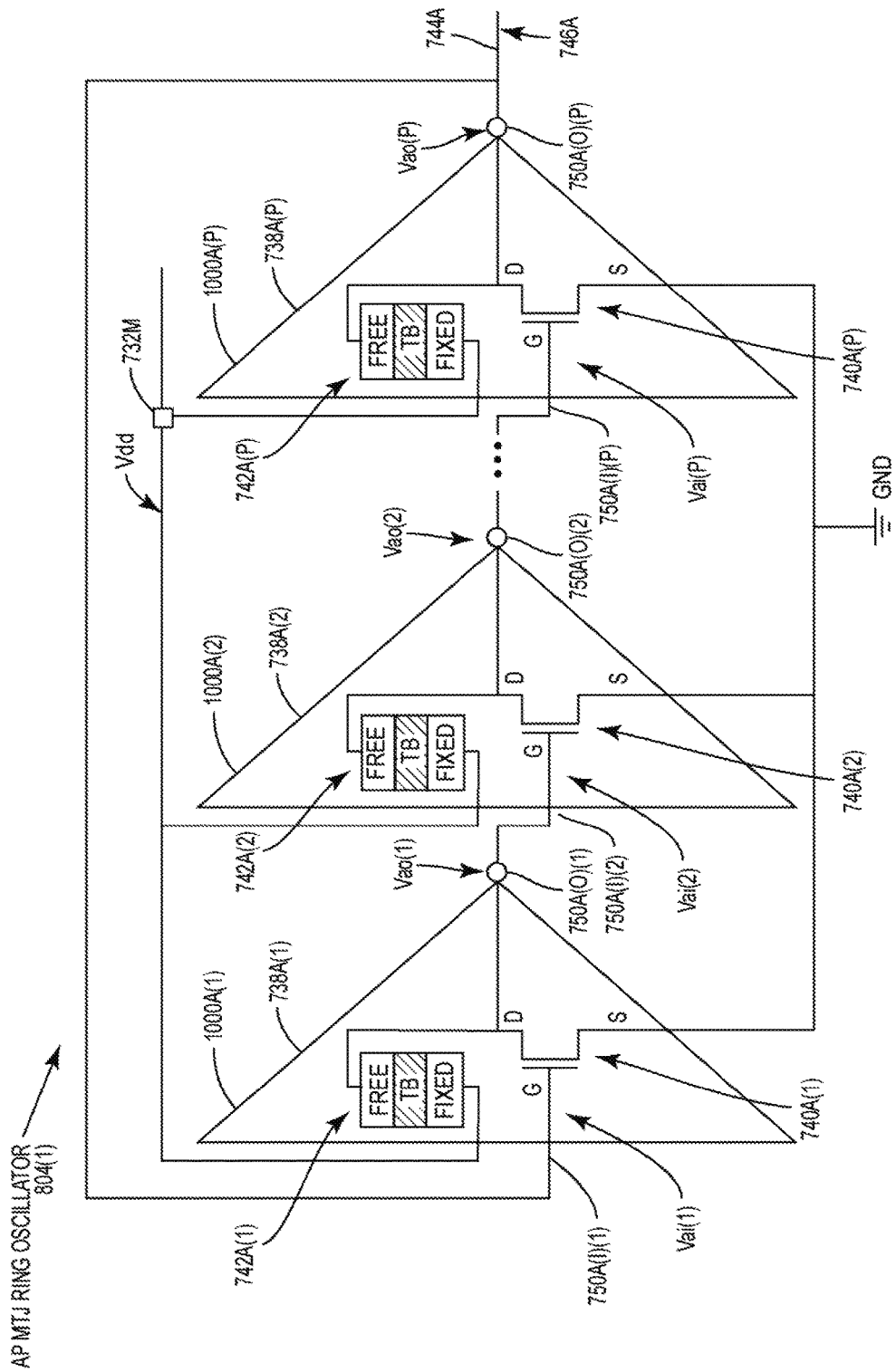
FIG. 13C is a schematic diagram of another exemplary MTJ ring oscillator circuit that includes an odd plurality of series connected MRAM circuits each comprising a measurement transistor coupled to an MTJ device with a pinned layer of the MTJ device coupled to a supply voltage, and a free layer of the MTJ device coupled to a drain of the measurement transistor to generate a process variation measurement voltage signal indicating an MTJ process variation in an MRAM bit cell in an AP magnetization state.

FIG. 12 illustrates examples of MTJ ring oscillators 802(1)-802(2), 804(1) in an alternative MTJ PVMC 736(2) that can be employed as the MTJ PVMC 736 in FIG. 8. FIGS. 13A-13C illustrate the MTJ ring oscillators 802(1)-802(2), 804(1) in more detail. FIG. 13A is the schematic diagram of the P MTJ ring oscillator 802(1) in FIG. 10A and thus will not be re-described.

FIG. 13B is a schematic diagram of another exemplary P MTJ ring oscillator 802(2) that can be employed as a P MTJ ring oscillator 802 in the MTJ PVMC 736 in FIG. 8. As discussed below, the P MTJ ring oscillator 802(2) is configured to generate the process variation measurement voltage signal 744P-2 as a function of process variation in the MRAM bit cells 406(0)(0)-406(M)(N) that are in the P magnetization state. This circuit scheme provides for the source degeneration body effect of the measurement transistors 740P-2(1)-740P-2(P) in the P MTJ ring oscillator 802(2) to be present, which increases the threshold voltage of the measurement transistors 740P-2(1)-740P-2(P) and the performance of the measurement transistors 740P-2(1)-740P-2(P). This circuit connection scheme may provide a closer representation of the MRAM bit cells 406(0)(0)-406(M)(N).

With continuing reference to FIG. 13B, the P MTJ ring oscillator 802(2) includes an odd number of at least three (3) of the MTJ circuits 738P-2(1)-738P-2(P) each comprising a respective inverting logic circuit 1000P-2(1)-1000P-2(P) connected in series with each other. An odd number of the inverting logic circuits 1000P-2(1)-1000P-2(P) is provided so that the process variation measurement voltage signal 746P-2 will alternate between different voltage states as a function of delay of voltage signal propagation through the P MTJ ring oscillator 802(2). Each inverting logic circuit 1000P-2(1)-1000P-2(P) has a respective MTJ input node 750P-2(I)(1)-750P-2(I)(P) and an MTJ output node 750P-2(O)(1)-750P-2(O)(P). Each inverting logic circuit 1000P-2(1)-1000P-2(P) includes a measurement transistor 740P-2(1)-740P-2(P) comprising a gate G, a source S, and a drain D. The sources S of each measurement transistor 740P-2(1)-740P-2(P) are coupled to the supply voltage input 732M. The measurement transistors 740P-2(1)-740P-2(P) may be selected to be a MOS type of the access transistors 414 provided in the MRAM bit cells 406(0)(0)-406(M)(N) in the memory system 700 in FIG. 7 so that the performance (i.e., drive strength) of the measurement transistor 740P-2(1)-740P-2(P) represents the performance and thus the process variation in the access transistors 414.

With continuing reference to FIG. 13B, each inverting logic circuit 1000A(1)-1000P-2(P) also includes a measurement MTJ device 742P-2(1)-742P-2(P) that includes a pinned layer FIXED, a free layer FREE, and a tunnel barrier TB disposed between the pinned layer FIXED and the free layer FREE. The measurement MTJ devices 742P-2(1)-742P-2(P) may be fabricated according to the same specifications as the MTJ devices 412 in the MRAM bit cells 406(0)(0)-406(M)(N) in the memory system 700 in FIG. 7 so that the resistance of the measurement MTJ devices 742P-2(1)-742P-2(P) represents the resistance, and thus the process variation, in the MTJ devices 412. The pinned layers FIXED of the measurement MTJ devices 742P-2(1)-742P-2(P) are coupled to the ground node GND to keep the measurement MTJ devices 742P-2(1)-742A(P) in a P magnetization state. The drains D of the measurement transistors 740P-2(1)-742P-2(P) are each coupled to the free layer FREE of the respective measurement MTJ device 742P-2(1)-742P-2(P) and the gates G of the measurement transistors 740P-2(1)-742P-2(P) in a succeeding inverting logic circuit 1000P-2(1)-1000P-2(P). The MTJ PVMC output 744P-2 is coupled to the gate G of the measurement transistor 740P-2(1) in the first inverting logic circuit 1000P-2(1).

The supply voltage Vdd being applied to the supply voltage input 732M causes a switching current to pass through the measurement MTJ devices 742P-2(1)-742P-2(P) and to the drain D of the measurement transistor 740P-2(1)-740P-2(P) to provide respective MTJ output voltages Vp-2o(1)-Vp-2o(P) on MTJ output nodes 750P-2(O)(1)-750P-2(O)(P). The MTJ output voltages Vp-2o(1)-Vp-2o(P) are provided as MTJ inputs voltages Vp-2i(2)-Vp-2i(P), Vp-2i(1) to MTJ input nodes 750P-2(I)(1)-750P-2(I)(P) of respective succeeding MTJ devices 742P-2(2)-742P-2(P), 742A(1). Thus, every odd measurement transistor 740P-2(1)-740P-2(P) will be turned on by the MTJ output voltage Vp-2o(1)-Vp-2o(P) at their respective gate G with the other measurement transistors 740P-2(1)-740P-2(P) turned off by the MTJ output voltage Vp-2o(1)-Vp-2o(P) at their respective gate G at a given time, switching back and forth between on and off states. Thus, the last MTJ voltage output Vp-2o(P) that provides the process variation measurement voltage signal 746P-2 will alternate states as a function of the performance affected by process variation of the inverting logic circuits 1000P-2(1)-1000P-2(P).

It may be desired to include both of the P MTJ ring oscillators 802(1), 802(2) in FIGS. 13A and 13B in the MTJ PVMC 736 in the MRAM bit cell PVMC 702 in FIG. 7 for example, so that the performance of the P MTJ ring oscillators 802(1), 802(2) can be combined or averaged to be used to determine process variation in the MRAM bit cells 406(0)(0)-406(M)(N). FIG. 12 is a schematic diagram that includes the MTJ ring oscillators 802(1), 802(2), 804(1) in FIGS. 13A-13C that can be provided in an MTJ PVMC 736(2) that can be provided as the MTJ PVMC 736 in FIG. 7, for example, to measure MTJ process variations in MRAM bit cells 406(0)(0)-406(M)(N) for P and AP magnetization states. In this regard, the delay performance of the MTJ ring oscillators 802(1), 802(2), 804(2) as indicated by the process variation measurement voltage signals 746P, 746P-2, 746A along with the delay performance as indicated by the logic process variation measurement voltage signal 746L can be used by the power management circuit 434 to determine the process variation in the MRAM bit cells 406(0)(0)-406(M)(N) to dynamically adjust the supply voltage Vdd for write operations. For example, the power management circuit 434 may be equipped with equations whose coefficients can be solved and stored in memory 448 in the power management circuit 434 as shown in FIGS. 4 and 7, to be used to calculate the supply voltage Vdd for write operations to be generated for write operations.

In this regard, the delay performance $\tau_{wl\_n}$ of the logic ring oscillator 800 in FIG. 7 is proportional to the parasitic capacitance C of the logic circuits 738L(1)-738L(P), the supply voltage $V_{dd}$ provided to the logic circuits 738L(1)-738L(P), and the drive current $I_n$ of the logic circuits 738L(1)-738L(P), as shown below in Equation 10:

$$\text{Logic RO: } \tau_{wl\_n} \propto \frac{CV_{dd}}{I_n} \qquad \text{Eq. (10)}$$

The delay performance $\tau_{mtj\_p}$ of the P MTJ ring oscillator 802(1) in FIG. 13A is proportional to the parasitic capacitance C of the measurement transistor 740P, the supply voltage $V_{dd}$ provided to the MTJ circuits 738P(1)-738P(P), and the effective drive current $I_{\text{eff}}$ of the MTJ circuits 738P(1)-738P(P), plus the delay performance $\tau_p$ as a result of the measurement MTJ device 742P resistance as shown below in Equation 11:

$$\text{MTJ Rp RO P: } \tau_{mtj\_p} \propto \frac{CV_{dd}}{I_{\text{eff}}} + \tau_p \approx \tau_{wl\_n} + \tau_p \qquad \text{Eq. (11)}$$

Thus, the delay performance $\tau_p$ solely as a result of the measurement MTJ device 742P resistance in the P magnetization state can be extracted by subtracting the determined delay performance $\tau_{wl\_n}$ of the logic ring oscillator 800 from the delay performance $\tau_{mtj\_p}$ of the P MTJ ring oscillator 802(1), as shown below in Equation 12:

$$\text{Extract } Rp\text{ Variation: } \tau_p = \tau_{mtj\_p} - \tau_{wl\_n} \qquad \text{Eq. (12)}$$

Similarly, the delay performance $\tau_{mtj\_p}$ of the P MTJ ring oscillator 802(1) in FIG. 13B is proportional to the parasitic capacitance C of the measurement transistor 740P, the supply voltage $V_{dd}$ provided to the MTJ circuits 738P(1)-738P(P), and the effective drive current $I_{\text{eff}}$ of the MTJ circuits 738P(1)-738P(P), plus the delay performance $\tau_p$ as a result of the measurement MTJ device 742P resistance as shown below in Equation 13:

$$\text{MTJ Rp RO P: } \tau_{mtj\_p} \propto \frac{CV_{dd}}{I_{\text{eff}}} + \tau_p \approx \tau_{wl\_n} + \tau_p \qquad \text{Eq. (13)}$$

Thus, the delay performance $\tau_p$ taking into consideration the body effect of the MTJ circuits 738P-2(1)-738P-2(P) solely as a result of the measurement MTJ device 742P-2 resistance in the P magnetization state can be extracted as shown below in Equation 14:

$$\text{Extract WL w/body effect Variation: } \tau_{wl\_b} = \tau_{mtj\_p\_b} - \tau_p \qquad \text{Eq. (14)}$$

Similarly, the delay performance $\tau_{mtj\_ap}$ of the AP MTJ ring oscillator 804(1) in FIG. 13C is proportional to the parasitic capacitance C of the measurement transistor 740A, the supply voltage $V_{dd}$ provided to the MTJ circuits 738A(1)-738A(P), and the effective drive current $I_{\text{eff}}$ of the MTJ circuits 738A(1)-738A(P), plus the delay performance $\tau_{ap}$ as a result of the measurement MTJ device 742A resistance as shown below in Equation 15:

$$\text{MTJ Rap RO A: } \tau_{mtj\_ap} \propto \frac{CV_{dd}}{I_{\text{eff}}} + \tau_{ap} \approx \tau_{wl\_n} + \tau_{ap} \qquad \text{Eq. (15)}$$

Thus, the delay performance $\tau_{ap}$ solely as a result of the measurement MTJ device 742A resistance in the AP magnetization state can be extracted by subtracting the determined delay performance $\tau_{wl\_n}$ of the logic ring oscillator 800 from the delay performance $\tau_{mtj\_ap}$ of the AP MTJ ring oscillator 804(1), as shown below in Equation 16:

$$\text{Extract Rap Variation: } \tau_{ap} = \tau_{mtj\_ap} - \tau_{wl\_n} \qquad \text{Eq. (16)}$$

As discussed above with regard to incorporating ambient temperature in calculating the supply voltage Vdd, the ambient temperature input 741 can receive the ambient temperature measurement voltage signal 746T representing ambient temperature at the MRAM bit cells 406(0)(0)-406(M)(N) as generated by the ambient temperature sensor 745. The ambient temperature input 741, which is coupled to the power management circuit 434, can transmit the ambient temperature measurement voltage signal 746T representing ambient temperature at the MRAM bit cells 406(0)(0)-406(M)(N) to the power management circuit 434. In one example, the power management circuit 434 can use logic circuits to compare the ambient temperature voltage signal 746T to values representing varying temperatures stored in the memory 448 of the power management circuit 434. A coefficient e(T) for determining a voltage $V_{c\_p}$ for switching the magnetization state of an MTJ device 412 in the MRAM bit cells 406(0)(0)-406(M)(N) from AP to P can be determined based on an output of the comparison logic circuits. Similarly, a coefficient f(T) for determining a voltage $V_{c\_ap}$ for switching the magnetization state of an MTJ device 412 in the MRAM bit cells 406(0)(0)-406(M)(N) from P to AP can be determined based on an output of the comparison logic circuits. In this manner, the coefficients e(T) and f(T) representing ambient temperature at the MRAM bit cells 406(0)(0)-406(M)(N) can be determined for use in determining the dynamic supply voltage Vdd ($V_{dyn\_p}$, $V_{dyn\_ap}$) for both P and AP magnetization state write operations.

Thus, with the process corners, measurement MTJ devices 742 and/or and measurement transistors 740 in the MTJ circuits 738(1)-738(P), and ambient temperature sensor information, the coefficients a(T), b(T), c(T), d(T), e(T), and f(T) shown below can be determined by the power management circuit 434 and stored in the memory 448 for different write operation scenarios to determine the dynamic supply voltage Vdd ($V_{dyn\_p}$, $V_{dyn\_ap}$) for both P and AP magnetization state write operations, as shown below in Equations 17 and 18. The dynamic supply voltage Vdd determined and generated by the power management circuit 434 can compensate for both individual logic and MTJ process variations against a typical process corner in the MRAM bit cells 406(0)(0)-406(M)(N), as well as ambient temperature at the MRAM bit cells 406(0)(0)-406(M)(N).

$$V_{dyn\_p} = a(T)*\tau_{wl\_b} + b(T)*\tau_p + e(T)*V_{c\_p} \qquad \text{Eq. (17)}$$

$$V_{dyn\_ap} = c(T)*\tau_{wl\_n} + d(T)*\tau_{ap} + f(T)*V_{c\_ap} \qquad \text{Eq. (18)}$$

ICs that include PVMCs to allow for dynamically generating a supply voltage at a desired voltage level for write operations to MRAM bit cells to account for process variations therein, and according to aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
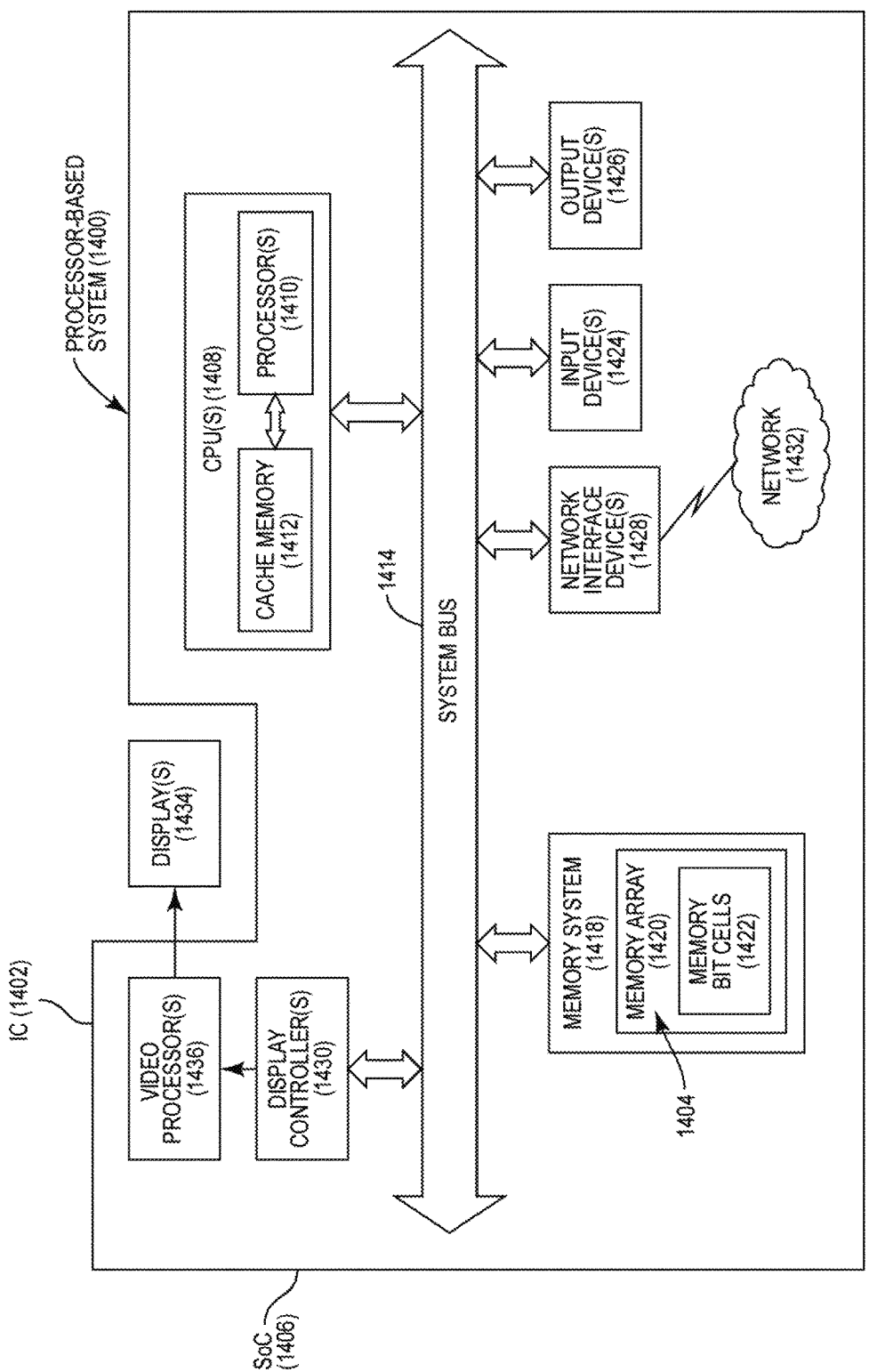
FIG. 14 is a block diagram of an exemplary processor-based system that can include a memory system that includes an MRAM array, an MRAM bit cell PVMC configured to determine MTJ and logic process variations representing MTJ and logic process variations in MRAM bit cells in the MRAM array and ambient temperature at the MRAM bit cells in the MRAM array, and a power management circuit configured to dynamically control a supply voltage provided to the MRAM array for access operations to account for such process variations and ambient temperatures, including but not limited to the memory systems in FIGS. 4 and 7, and the PVMCs in FIGS. 8-13C.

In this regard, FIG. 14 illustrates an example of a processor-based system 1400 that can be included in an IC 1402 including PVMCs 1404 to allow for dynamically generating a supply voltage at a desired voltage level for write operations to MRAM bit cells to account for process variations therein. The IC 1402 may be included in or provided as a system on a chip (SoC) 1406. The processor-based system 1400 includes one or more CPUs 1408 that include one or more processors 1410. The CPU(s) 1408 may have a cache memory 1412 coupled to the processor(s) 1410 for rapid access to temporarily stored data. The CPU(s) 1408 is coupled to a system bus 1414 and can intercouple master and slave devices included in the processor-based system 1400. As is well known, the CPU(s) 1408 communicates with these other devices by exchanging address, control, and data information over the system bus 1414. Although not illustrated in FIG. 14, multiple system buses 1414 could be provided, wherein each system bus 1414 constitutes a different fabric. For example, the CPU(s) 1408 can communicate bus transaction requests to a memory system 1418 as an example of a slave device. The memory system 1418 may include a memory array 1420 that includes memory bit cells 1422. The memory bit cells 1422 may be MRAM bit cells for example.

Other master and slave devices can be connected to the system bus 1414. As illustrated in FIG. 14, these devices can include the memory system 1418, and one or more input devices 1424. The input device(s) 1424 can include any type of input device, including, but not limited to, input keys, switches, voice processors, etc. The other devices can also include one or more output devices 1426, and one or more network interface devices 1428. The output device(s) 1426 can include any type of output device, including, but not limited to, audio, video, other visual indicators, etc. The other devices can also include one or more display controllers 1430 as examples. The network interface device(s) 1428 can be any device configured to allow exchange of data to and from a network 1432. The network 1432 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1428 can be configured to support any type of communications protocol desired.

The CPU(s) 1408 may also be configured to access the display controller(s) 1430 over the system bus 1414 to control information sent to one or more displays 1434. The display controller(s) 1430 sends information to the display(s) 1434 to be displayed via one or more video processors 1436, which process the information to be displayed into a format suitable for the display(s) 1434. The display(s) 1434 can include any type of display, including, but not limited to, a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magneto-resistive random access memory (MRAM) bit cell process variation measurement circuit (PVMC) for determining process variation and ambient temperature in MRAM bit cells in an MRAM array, the MRAM bit cell PVMC comprising:
   a supply voltage input configured to receive a supply voltage coupled to the MRAM array;
   an MRAM bit cell PVMC output;
   a magnetic tunnel junction (MTJ) PVMC coupled to the supply voltage input, the MTJ PVMC comprising:
      one or more MTJ circuits, each comprising:
         a measurement transistor of a metal oxide semiconductor (MOS) type of an access transistor in at least one MRAM bit cell in the MRAM array; and
         a measurement MTJ device of a type of an MTJ device in the at least one MRAM bit cell in the MRAM array, the measurement MTJ device coupled to the measurement transistor; and
      an MTJ PVMC output coupled to the MRAM bit cell PVMC output; and
   an ambient temperature input coupled to the MRAM bit cell PVMC output, the ambient temperature input configured to receive an ambient temperature measurement voltage signal representing an ambient temperature at the at least one MRAM bit cell in the MRAM array;
   the MRAM bit cell PVMC configured to provide, on the MRAM bit cell PVMC output, at least one MRAM bit cell PVMC output voltage signal representing:
      the process variation of at least one MRAM bit cell in the MRAM array as a function of the supply voltage coupled to the MRAM bit cell PVMC; and
      the ambient temperature at the at least one MRAM bit cell in the MRAM array.

2. The MRAM bit cell PVMC of claim 1, further comprising:
   at least one temperature sensor coupled to the ambient temperature input, wherein the at least one temperature sensor is configured to generate the ambient temperature measurement voltage signal representing ambient temperature at the at least one MRAM bit cell in the MRAM array.

3. The MRAM bit cell PVMC of claim 1, wherein:
   the MRAM bit cell PVMC further comprises a first temperature sensor coupled to the ambient temperature input, wherein the first temperature sensor is configured to generate a first ambient temperature measurement voltage signal; and
   the MRAM array further comprises a second temperature sensor coupled to the ambient temperature input, wherein the second temperature sensor is configured to generate a second ambient temperature measurement voltage signal;
   wherein the ambient temperature input is configured to receive the first and second ambient temperature measurement voltage signals and generate at least one resultant ambient temperature measurement voltage signal representing ambient temperature at the at least one MRAM bit cell in the MRAM array based on at least one of the first and second ambient temperature measurement voltage signals.

4. The MRAM bit cell PVMC of claim 1, wherein, for at least one MTJ circuit of the one or more MTJ circuits:
   the measurement MTJ device further comprises a pinned layer, a free layer, and a tunnel barrier disposed between the pinned layer and the free layer; and
   the measurement transistor is coupled to the pinned layer of the measurement MTJ device.

5. The MRAM bit cell PVMC of claim 4, wherein, for the at least one MTJ circuit of the one or more MTJ circuits:
   the measurement transistor further comprises a gate, a drain, and a source;
   the drain of the measurement transistor is coupled to the pinned layer of the measurement MTJ device;
   the free layer of the measurement MTJ device is coupled to the supply voltage input; and
   the source of the measurement transistor is coupled to a ground node.

6. The MRAM bit cell PVMC of claim 4, wherein, for the at least one MTJ circuit of the one or more MTJ circuits:
   the measurement transistor further comprises a gate, a drain, and a source;
   the drain of the measurement transistor is coupled to the pinned layer of the measurement MTJ device;
   the free layer of the measurement MTJ device is coupled to a ground node; and
   the source of the measurement transistor is coupled to the supply voltage input.

7. The MRAM bit cell PVMC of claim 1, wherein, for at least one MTJ circuit of the one or more MTJ circuits:
   the measurement MTJ device further comprises a pinned layer, a free layer, and a tunnel barrier disposed between the pinned layer and the free layer; and
   the measurement transistor is coupled to the free layer of the measurement MTJ device.

8. The MRAM bit cell PVMC of claim 7, wherein, for the at least one MTJ circuit of the one or more MTJ circuits:
   the measurement transistor further comprises a gate, a drain, and a source;
   the drain of the measurement transistor is coupled to the free layer of the measurement MTJ device;
   the pinned layer of the measurement MTJ device is coupled to the supply voltage input; and
   the source of the measurement transistor is coupled to a ground node.

9. The MRAM bit cell PVMC of claim 7, wherein, for the at least one MTJ circuit of the one or more MTJ circuits:
   the measurement transistor further comprises a gate, a drain, and a source;

the drain of the measurement transistor is coupled to the free layer of the measurement MTJ device;
the pinned layer of the measurement MTJ device is coupled to a ground node; and
the source of the measurement transistor is coupled to the supply voltage input.

10. The MRAM bit cell PVMC of claim 7, wherein, for at least one other MTJ circuit of the one or more MTJ circuits:
the measurement MTJ device further comprises the pinned layer, the free layer, and the tunnel barrier disposed between the pinned layer and the free layer; and
the measurement transistor is coupled to the pinned layer of the measurement MTJ device.

11. The MRAM bit cell PVMC of claim 1, wherein the MRAM bit cell PVMC comprises an MTJ ring oscillator comprising the one or more MTJ circuits, wherein the MTJ ring oscillator comprises:
an odd number of at least three of the one or more MTJ circuits each comprising an MTJ input node and an MTJ output node, the at least three of the one or more MTJ circuits each comprising:
the measurement transistor comprising a gate, a source, and a drain;
the measurement MTJ device comprising a pinned layer, a free layer, and a tunnel barrier disposed between the pinned layer and the free layer;
the free layer of the measurement MTJ device coupled to the supply voltage input;
the source of the measurement transistor coupled to a ground node; and
the drain of the measurement transistor coupled to the pinned layer of the measurement MTJ device and the gate of the measurement transistor in a succeeding MTJ circuit in the at least three of the one or more MTJ circuits; and
the MTJ PVMC output coupled to the gate of the measurement transistor in a first MTJ circuit of the at least three of the one or more MTJ circuits.

12. The MRAM bit cell PVMC of claim 1, wherein the MRAM bit cell PVMC comprises an MTJ ring oscillator comprising the one or more MTJ circuits, wherein the MTJ ring oscillator comprises:
an odd number of at least three of the one or more MTJ circuits each comprising an MTJ input node and an MTJ output node, the at least three of the one or more MTJ circuits each comprising:
the measurement transistor comprising a gate, a source, and a drain;
the measurement MTJ device comprising a pinned layer, a free layer, and a tunnel barrier disposed between the pinned layer and the free layer;
the pinned layer of the measurement MTJ device coupled to the supply voltage input;
the source of the measurement transistor coupled to a ground node; and
the drain of the measurement transistor coupled to the free layer of the measurement MTJ device and the gate of the measurement transistor in a succeeding MTJ circuit in the at least three of the one or more MTJ circuits; and
the MTJ PVMC output coupled to the gate of the measurement transistor in a first MTJ circuit of the at least three of the one or more MTJ circuits.

13. The MRAM bit cell PVMC of claim 1, wherein the MRAM bit cell PVMC comprises an MTJ ring oscillator comprising the one or more MTJ circuits, wherein the MTJ ring oscillator comprises:
an odd number of at least three of the one or more MTJ circuits each comprising an MTJ input node and an MTJ output node, the at least three of the one or more MTJ circuits each comprising:
the measurement transistor comprising a gate, a source, and a drain;
the measurement MTJ device comprising a pinned layer, a free layer, and a tunnel barrier disposed between the pinned layer and the free layer;
the free layer of the measurement MTJ device coupled to a ground node;
the source of the measurement transistor coupled to the supply voltage input; and
the drain of the measurement transistor coupled to the pinned layer of the measurement MTJ device and the gate of the measurement transistor in a succeeding MTJ circuit in the at least three of the one or more MTJ circuits; and
the MTJ PVMC output coupled to the gate of the measurement transistor in a first MTJ circuit of the at least three of the one or more MTJ circuits.

14. The MRAM bit cell PVMC of claim 1, wherein the MRAM bit cell PVMC comprises an MTJ ring oscillator comprising the one or more MTJ circuits, wherein the MTJ ring oscillator comprises:
an odd number of at least three of the one or more MTJ circuits each comprising an MTJ input node and an MTJ output node, the at least three of the one or more MTJ circuits each comprising:
the measurement transistor comprising a gate, a source, and a drain;
the measurement MTJ device comprising a pinned layer, a free layer, and a tunnel barrier disposed between the pinned layer and the free layer;
the pinned layer of the measurement MTJ device coupled to a ground node;
the source of the measurement transistor coupled to the supply voltage input; and
the drain of the measurement transistor coupled to the free layer of the measurement MTJ device and the gate of the measurement transistor in a succeeding MTJ circuit in the at least three of the one or more MTJ circuits; and
the MTJ PVMC output coupled to the gate of the measurement transistor in a first MTJ circuit of the at least three of the one or more MTJ circuits.

15. The MRAM bit cell PVMC of claim 1, further comprising:
a logic PVMC coupled to the supply voltage input, the logic PVMC comprising:
one or more logic circuits each comprising a second measurement transistor of the MOS type of the access transistor in the at least one MRAM bit cell in the MRAM array; and
a logic PVMC output coupled to the MRAM bit cell PVMC output;
the logic PVMC configured to generate, on the logic PVMC output, a logic process variation measurement voltage signal representing process variation of the access transistor in the at least one MRAM bit cell in the MRAM array, as a function of the supply voltage coupled to the logic PVMC.

16. The MRAM bit cell PVMC of claim 15, wherein the logic PVMC comprises a logic ring oscillator, wherein the logic ring oscillator comprises an odd number of the one or more logic circuits comprising at least three inverting logic circuits each comprising a logic input node and a logic output node, the at least three inverting logic circuits each configured to:
   receive a logic input voltage on the logic input node from the logic output node of a preceding inverting logic circuit among the at least three inverting logic circuits; and
   generate a logic output voltage on the logic output node based on an inversion operation of the logic input voltage;
   wherein the logic PVMC output is coupled to the logic output node of a last inverting logic circuit among the at least three inverting logic circuits.

17. The MRAM bit cell PVMC of claim 1 integrated into an integrated circuit (IC).

18. The MRAM bit cell PVMC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A memory system, comprising:
   a power management circuit configured to generate a supply voltage;
   a magneto-resistive random access memory (MRAM) array coupled to the supply voltage, the MRAM array comprised of a plurality of MRAM bit cells, each MRAM bit cell among the plurality of MRAM bit cells comprising a magnetic tunnel junction (MTJ) device coupled to an access transistor; and
   an MRAM bit cell process variation measurement circuit (PVMC) for determining process variation in the plurality of MRAM bit cells in the MRAM array, the MRAM bit cell PVMC comprising:
      a supply voltage input configured to receive the supply voltage generated by the power management circuit;
      an MRAM bit cell PVMC output coupled to the power management circuit;
      an MTJ PVMC coupled to the supply voltage input, the MTJ PVMC comprising:
         one or more MTJ circuits, each comprising:
            a measurement transistor of a metal oxide semiconductor (MOS) type of the access transistor in at least one MRAM bit cell among the plurality of MRAM bit cells in the MRAM array; and
            a measurement MTJ device of a type of the MTJ device in the at least one MRAM bit cell among the plurality of MRAM bit cells in the MRAM array, the measurement MTJ device coupled to the measurement transistor; and
         an MTJ PVMC output coupled to the MRAM bit cell PVMC output; and
         the MTJ PVMC configured to generate, on the MTJ PVMC output, a process variation measurement voltage signal representing process variation of the at least one MRAM bit cell among the plurality of MRAM bit cells in the MRAM array, as a function of the supply voltage coupled to the MRAM bit cell PVMC;
      the MRAM bit cell PVMC configured to provide, on the MRAM bit cell PVMC output, at least one MRAM bit cell PVMC output voltage signal representing the process variation of at least one MRAM bit cell in the MRAM array as a function of the supply voltage coupled to the MRAM bit cell PVMC;
   an ambient temperature input coupled to the power management circuit, the ambient temperature input configured to receive an ambient temperature measurement voltage signal representing ambient temperature of at the at least one MRAM bit cell among the plurality of MRAM bit cells in the MRAM array; and
   the power management circuit further configured to:
      receive the MRAM bit cell PVMC output voltage signal from the MRAM bit cell PVMC;
      receive the ambient temperature measurement voltage signal from the ambient temperature input;
      determine a supply voltage level based on the received process variation measurement voltage signal and the received ambient temperature measurement voltage signal; and
      dynamically generate the supply voltage at the determined supply voltage level.

20. The memory system of claim 19, wherein the power management circuit is configured to determine the supply voltage level by being configured to:
   determine a delay performance of the MRAM bit cell PVMC based on the received process variation measurement voltage signal; and
   determine the supply voltage level based on the determined delay performance.

21. The memory system of claim 19, wherein the MRAM bit cell PVMC further comprises a logic PVMC coupled to the supply voltage input, the logic PVMC comprising:
   one or more logic circuits each comprising a second measurement transistor of the MOS type of the access transistor in the at least one MRAM bit cell among the plurality of MRAM bit cells in the MRAM array; and
   a logic PVMC output;
   wherein:
      the logic PVMC is configured to generate, on the logic PVMC output, a logic process variation measurement voltage signal representing process variation in the second measurement transistor representing process variation of the access transistor in the at least one MRAM bit cell among the plurality of MRAM bit cells in the MRAM array, as a function of the supply voltage coupled to the logic PVMC;
      the power management circuit is further configured to receive the logic process variation measurement voltage signal from the logic PVMC; and
      the power management circuit is further configured to determine the supply voltage level based on the received process variation measurement voltage signal and the received logic process variation measurement voltage signal.

22. The memory system of claim 21, wherein the power management circuit is configured to determine the supply voltage level by being configured to:

determine an MTJ delay performance of the MTJ PVMC based on the received process variation measurement voltage signal; and determine a logic delay performance of the logic PVMC based on the received logic process variation measurement voltage signal.

23. The memory system of claim 22, wherein the power management circuit is configured to determine the supply voltage level by being configured to determine the supply voltage level based on the determined MTJ delay performance and the determined logic delay performance.

24. The memory system of claim 23, wherein the power management circuit is further configured to determine the supply voltage level by being configured to:

determine ambient temperature at the at least one MRAM bit cell among the plurality of MRAM bit cells in the MRAM array based on the received ambient temperature measurement voltage signal.

25. The memory system of claim 19 further configured to generate the ambient temperature measurement voltage signal representing an ambient temperature below seventy degrees Celsius (70° C.) at the at least one MRAM bit cell in the MRAM array.

\* \* \* \* \*